US012255663B2

(12) United States Patent
Moslehi Bajestan et al.

(10) Patent No.: US 12,255,663 B2
(45) Date of Patent: Mar. 18, 2025

(54) DUAL-PATH PHASE LOCKED LOOP (PLL) WITH CLOSED-LOOP VCO TEMPERATURE COMPENSATION

(71) Applicant: QUALCOMM Incorporated, San Diego, CA (US)

(72) Inventors: Masoud Moslehi Bajestan, San Diego, CA (US); Arpit Gupta, San Diego, CA (US); Wu-Hsin Chen, San Diego, CA (US); Vinod Panikkath, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 19 days.

(21) Appl. No.: 18/185,325

(22) Filed: Mar. 16, 2023

(65) Prior Publication Data

US 2024/0313792 A1   Sep. 19, 2024

(51) Int. Cl.
*H03L 7/099* (2006.01)
*H03L 1/02* (2006.01)
*H03L 7/087* (2006.01)

(52) U.S. Cl.
CPC .......... *H03L 7/0992* (2013.01); *H03L 1/021* (2013.01); *H03L 7/087* (2013.01)

(58) Field of Classification Search
CPC .......... G06F 1/324; G06F 1/08; G06F 1/3296; G06F 1/3203; G06F 1/04; G06F 1/329; G06F 1/12; G06F 1/3225; G06F 1/3237; H03B 5/04; H03B 5/368; H03B 5/32; H03B 5/1228; H03B 5/1215; H03B 5/362; H03B 5/1243; H03B 2200/0038; H03B 5/36; H03L 7/099; H03L 1/022; H03L 1/026; H03L 1/00; H03L 1/028; H03L 1/02; H03L 7/093; H03L 1/023; H03L 1/04
USPC ........................................................ 375/376
See application file for complete search history.

(56) References Cited

U.S. PATENT DOCUMENTS

| | | | |
|---|---|---|---|
| 7,546,097 B2 | 6/2009 | Dunworth et al. | |
| 8,432,200 B1 * | 4/2013 | Thakur .................. | H03L 7/0893 327/147 |
| 10,630,301 B1 * | 4/2020 | Bekele .................. | H03L 7/0895 |
| 10,749,532 B1 * | 8/2020 | Raj ........................ | H03L 1/022 |
| 10,992,301 B1 * | 4/2021 | Mitric ................... | H03L 7/0994 |
| 11,811,362 B1 * | 11/2023 | Baldisserotto ......... | H03L 1/022 |

(Continued)

OTHER PUBLICATIONS

Liu T., et al., "A Temperature Compensated Triple-Path PLL with KVCO Non-Linearity Desensitization Capable of Operating at 77 K", IEEE Transactions on Circuits and Systems—I: Regular Papers, May 2017, pp. 1-9.

(Continued)

*Primary Examiner* — Eva Y Puente
(74) *Attorney, Agent, or Firm* — Loza & Loza LLP

(57) ABSTRACT

In certain aspects, a system includes a voltage-controlled oscillator (VCO), a phase detector configured to receive a reference signal, a frequency divider coupled between an output of the VCO and the phase detector, a phase-to-current circuit coupled to an output of the phase detector, and a temperature circuit configured to output a temperature-dependent voltage. The system also includes a switching circuit configured to selectively couple the phase-to-current circuit to an input of the VCO and configured to selectively couple the temperature circuit to the input of the VCO.

24 Claims, 19 Drawing Sheets

(56) References Cited

U.S. PATENT DOCUMENTS

| | | | |
|---|---|---|---|
| 2003/0155903 A1* | 8/2003 | Gauthier | H03M 1/0621 |
| | | | 374/E7.035 |
| 2006/0158264 A1 | 7/2006 | Kousai et al. | |
| 2006/0258313 A1 | 11/2006 | Uozumi et al. | |
| 2007/0002993 A1 | 1/2007 | Wang et al. | |
| 2008/0150641 A1* | 6/2008 | Costa | H03L 7/099 |
| | | | 331/16 |
| 2009/0039969 A1* | 2/2009 | Hachigo | H03L 7/099 |
| | | | 331/1 R |
| 2011/0316595 A1* | 12/2011 | Bolton | H03L 7/099 |
| | | | 327/156 |
| 2013/0328638 A1* | 12/2013 | Chang | H03L 7/099 |
| | | | 331/36 R |
| 2019/0326915 A1 | 10/2019 | Moslehi Bajestan et al. | |
| 2020/0021243 A1* | 1/2020 | Uehara | H03B 5/368 |

OTHER PUBLICATIONS

International Search Report and Written Opinion—PCT/US2024/015628—ISA/EPO—Jun. 25, 2024.

* cited by examiner

DUAL-PATH PHASE LOCKED LOOP (PLL) WITH CLOSED-LOOP VCO TEMPERATURE COMPENSATION

BACKGROUND

Field

Aspects of the present disclosure relate generally to frequency synthesis, and more particularly, to phase locked loops (PLLs).

Background

A phase locked loop (PLL) may be used in frequency synthesis to generate a signal having a desired frequency by multiplying the frequency of a reference signal by a multiplier that achieves the desired frequency. PLLs are widely used to provide signals having desired frequencies in wireless communication systems, micro-processing systems, and high-speed data systems.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a voltage-controlled oscillator (VCO) having a first input and an output, a phase detector having a first input, a second input, and an output, wherein the first input of the phase detector is configured to receive a reference signal, and a frequency divider coupled between the output of the VCO and the second input of the phase detector. The system also includes a phase-to-current circuit having an input and an output, wherein the input of the phase-to-current circuit is coupled to the output of the phase detector, and a temperature circuit having an output, wherein the temperature circuit is configured to output a temperature-dependent voltage at the output of the temperature circuit. The system further includes a switching circuit having a first terminal, a second terminal, and a third terminal, wherein the first terminal is coupled to the output of the phase-to-current circuit, the second terminal is coupled to the output of the temperature circuit, and the third terminal is coupled to the first input of the VCO. The system further includes a capacitor coupled to the first input of the VCO.

A second aspect relates to a method for operating a phase locked loop (PLL). The PLL includes a voltage-controlled oscillator (VCO), the VCO including a voltage-controlled capacitor and a capacitor bank. The method includes, in a first mode, coupling a temperature-dependent voltage to the voltage-controlled capacitor, and tuning a capacitance of the capacitor bank. The method also includes, in a second mode, coupling the voltage-controlled capacitor in a feedback loop of the PLL.

A third aspect relates to an apparatus. The apparatus includes a voltage-controlled oscillator (VCO) including a voltage-controlled capacitor and a capacitor bank, means for generating a temperature-dependent voltage, means for inputting the temperature-dependent voltage to the voltage-controlled capacitor in a first mode, means for tuning a capacitance of the capacitor bank in the first mode, and means for coupling the voltage-controlled capacitor in a feedback loop of a phase locked loop (PLL) including the VCO in a second mode.

A fourth aspect relates to a system. The system includes a voltage-controlled oscillator (VCO), a phase detector configured to receive a reference signal, a frequency divider coupled between an output of the VCO and the phase detector, a phase-to-voltage circuit coupled to an output of the phase detector, a transconductance device coupled to an output of the phase-to-voltage circuit, a temperature circuit configured to output a temperature-dependent voltage, and a switching circuit configured to selectively couple the transconductance device to an input of the VCO and configured to selectively couple the temperature circuit to the input of the VCO.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
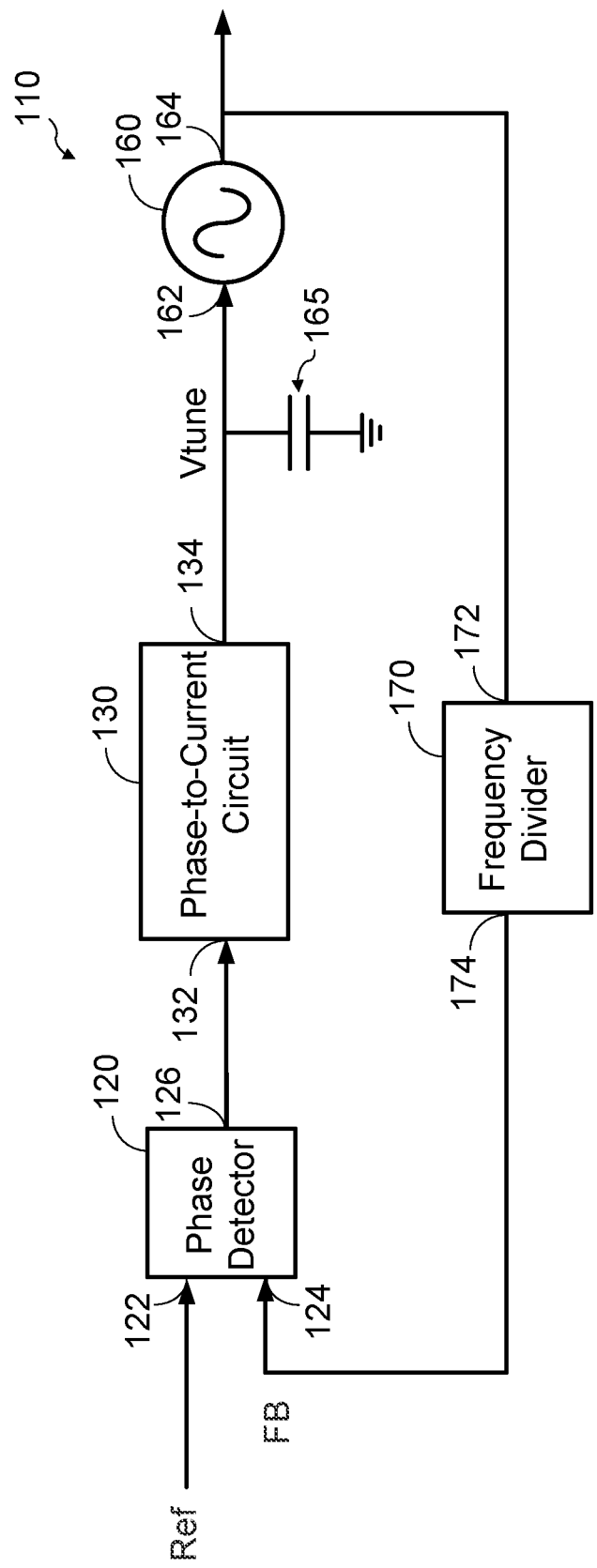
FIG. 1 shows an example of a phase locked loop (PLL) according to certain aspects of the present disclosure.

FIG. 1 shows an example of a PLL 110 according to certain aspects of the present disclosure. The PLL 110 may be used to generate a signal having a desired frequency in a wireless communication system, a micro-processing system, a high-speed data system, etc. For example, the PLL 110 may be used in a wireless communications system to generate a local oscillator signal having a desired frequency.

The PLL 110 includes a phase detector 120 (also referred to as a phase frequency detector (PFD)), a phase-to-current circuit 130, a capacitor 165, a voltage-controlled oscillator (VCO) 160, and a frequency divider 170. The VCO 160 has an input 162 and an output 164. The VCO 160 is configured to generate an output signal at the output 164 having a frequency that is tuned by a control voltage (labeled "Vtune") received at the input 162, as discussed further below. The output signal of the VCO 160 provides the output signal of the PLL 110.

The output signal of the VCO 160 is fed back to the phase detector 120 via a feedback loop including a frequency divider 170. The frequency divider 170 has an input 172 coupled to the output 164 of the VCO 160 and an output 174 coupled to the phase detector 120. The frequency divider 170 is configured to receive the output signal of the VCO 160 at the input 172, divide the frequency of the output signal to generate a feedback signal (labeled "FB"), and output the feedback signal to the phase detector 120 via the output 174. The feedback signal has a frequency equal to $f_{out}/N$, where $f_{out}$ is the frequency of the output signal of the VCO 160, and N is a divider of the frequency divider 170.

The phase detector 120 has a first input 122, a second input 124 coupled to the output 174 of the frequency divider 170, and an output 126 coupled to the phase-to-current circuit 130. The phase detector 120 is configured to receive a reference signal (labeled "Ref") at the first input 122 and receive the feedback signal at the second input 124. The reference signal provides a reference frequency for the PLL 110 and may include a clock signal from a crystal oscillator or another stable clock source. The phase detector 120 is configured to detect a phase difference (i.e., a phase error) between the reference signal and the feedback signal, and output a phase signal at the output 126 indicating the detected phase difference (i.e., phase error).

The phase-to-current circuit 130 has an input 132 coupled to the output 126 of the phase detector 120, and an output 134 coupled to the capacitor 165. The phase-to-current circuit 130 is configured to receive the phase signal from the phase detector 120 at the input 132, generate a current based on the phase signal, and provide the current at the output 134. The current may flow in either direction (e.g., depending on whether the reference signal leads or lags the feedback signal). The capacitor 165 is coupled between the output 134 of the phase-to-current circuit 130 and the input 162 of the VCO 160. The capacitor 165 integrates the current from the phase-to-current circuit 130 to generate the control voltage (labeled "Vtune") for the VCO 160, which tunes the frequency of the VCO 160.

The feedback loop of the PLL 110 causes the control voltage to tune the frequency of the VCO 160 in a direction that reduces the phase difference (i.e., phase error) between the feedback signal and the reference signal. When the PLL 110 is locked, the frequency of the feedback signal is approximately equal to the frequency of the reference signal. Since the frequency of the feedback signal is approximately equal to the frequency of the output signal of the VCO 160 divided by N, this causes the frequency of the output signal of the VCO 160 to be approximately equal to N times the frequency of the reference signal. Thus, the PLL 110 multiplies the frequency of the reference signal by N. The frequency of the output signal of the VCO 160 (which provides the output signal of the PLL 110) may be set to a desired frequency, for example, by setting the value of N accordingly.

Figure 2:
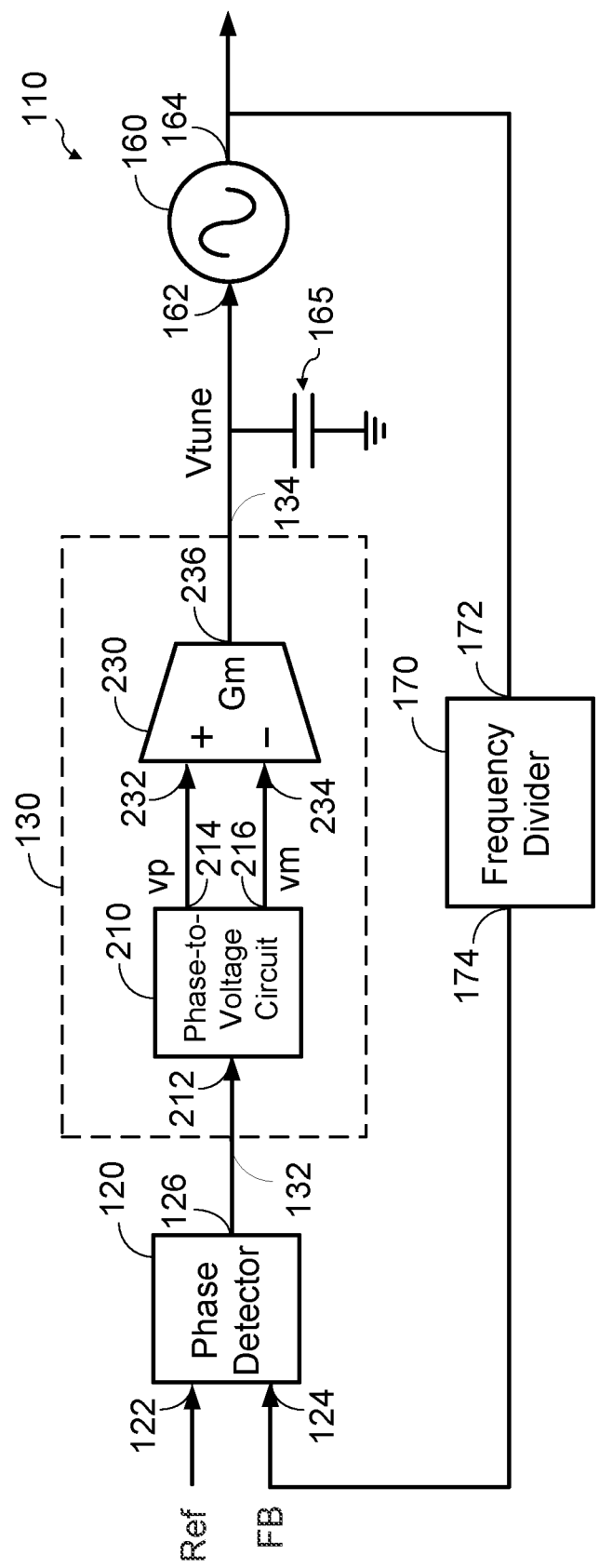
FIG. 2 shows an exemplary implementation of a phase-to-current circuit according to certain aspects of the present disclosure.

FIG. 2 shows an exemplary implementation of the phase-to-current circuit 130 according to certain aspects. In this example, the phase-to-current circuit 130 includes a phase-to-voltage circuit 210 and a transconductance amplifier 230. The transconductance amplifier 230 may also be referred to as a transconductor, a Gm cell, a transconductance device, or another term.

The phase-to-voltage circuit 210 has an input 212 coupled to the output 126 of the phase detector 120, a first output 214, and a second output 216. The phase-to-voltage circuit 210 is configured to receive the phase signal from the phase detector 120 at the input 212, and generate a differential voltage including a first voltage (labeled "vp") and a second voltage (labeled "vm") based on the phase signal. The phase-to-voltage circuit 210 outputs the first voltage at the first output 214 and outputs the second voltage at the second output 216. In some implementations, the polarity of the voltage difference between the first voltage and the second voltage (e.g., vp-vm) indicates whether the reference signal leads or lags the feedback signal. However, it is to be appreciated that the present disclosure is not limited to this example. An exemplary implementation of the phase-to-voltage circuit 210 is discussed further below with reference to FIG. 11.

The transconductance amplifier 230 has a first input 232 coupled to the first output 214 of the phase-to-voltage circuit 210, a second input 234 coupled to the second output 216 of the phase-to-voltage circuit 210, and an output 236 coupled to the capacitor 165. The transconductance amplifier 230 is configured to receive the first voltage at the first input 232, receive the second voltage at the second input 234, generate a current based on the voltage difference between the first voltage and the second voltage, and provide the current at the output 236. The direction of the current may depend on the polarity of the voltage difference between the first voltage and the second voltage, and hence, depend on whether the reference signal leads or lags the feedback signal.

It is to be appreciated that the phase-to-current circuit 130 is not limited to the exemplary implementation shown in FIG. 2. For example, in some implementations, the phase-to-current circuit 130 may include one or more charge pumps, and/or one or more other components. It is also be appreciated that the PLL 110 may include one or more additional components between the phase-to-current circuit 130 and the VCO. For example, in some implementations, the PLL 110 may further include a resistor and a ripple capacitor coupled in series between the input 162 of the VCO 160 and ground.

Figure 3:
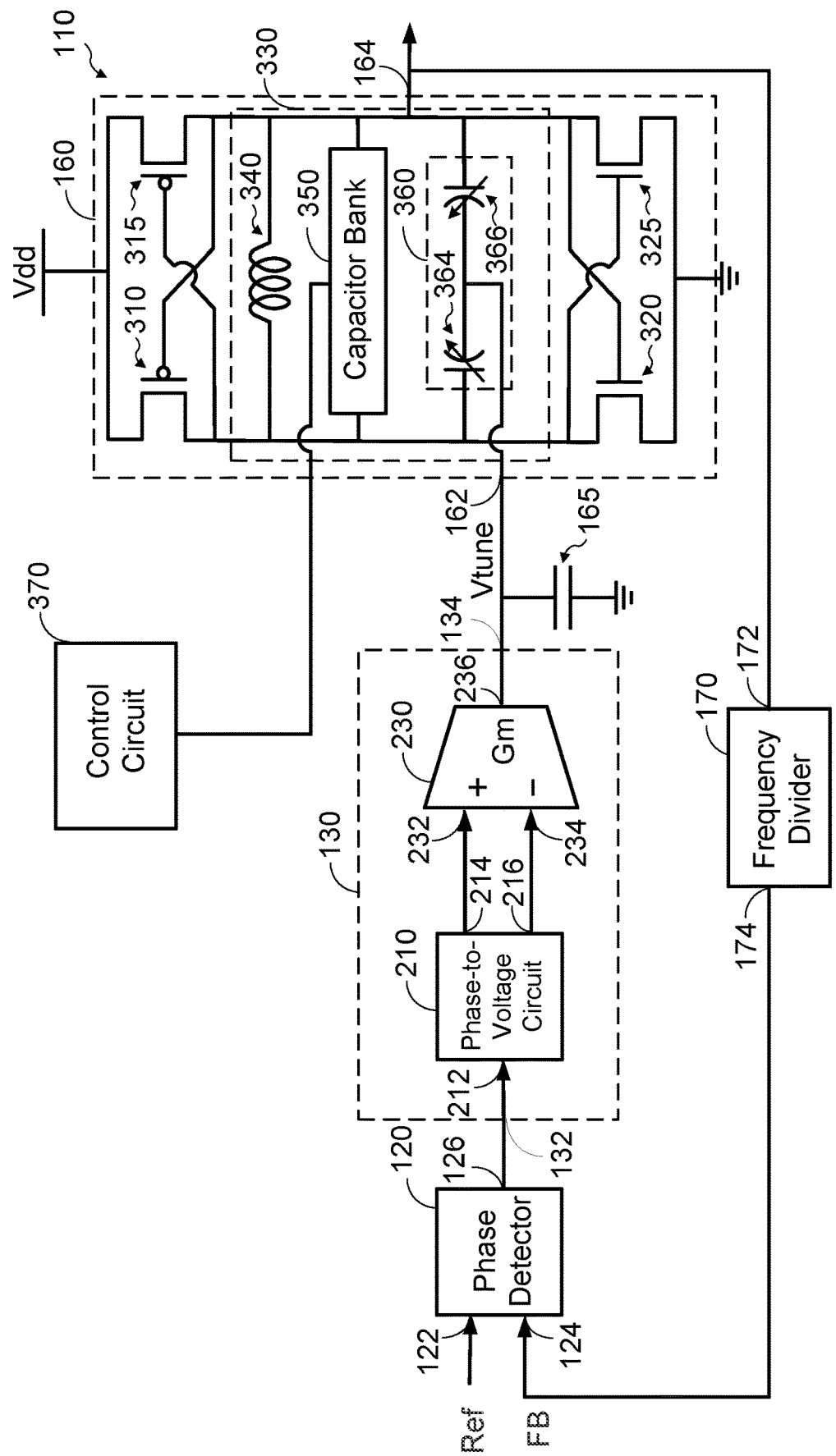
FIG. 3 shows an exemplary implementation of a voltage-controlled oscillator (VCO) according to certain aspects of the present disclosure.

FIG. 3 shows an exemplary implementation of the VCO 160 according to certain aspects. In this example, the VCO 160 includes an inductor-capacitor (LC) tank 330, a first pair of cross-coupled transistors 310 and 315 (e.g., p-type field effect transistors (PFETs), and a second pair of cross-coupled transistors 320 and 325 (e.g., n-type field effect transistors (NFETs)). In this disclosure, two transistors are cross-coupled when the gate of each of the transistors is coupled to the drain of the other one of the transistors. In the example shown in FIG. 3, the first pair of cross-coupled transistors 310 and 315 is between the supply rail and the LC tank 330, and the second pair of cross-coupled transistors 320 and 325 is between the LC tank 330 and ground.

The LC tank 330 includes an inductor 340, a capacitor bank 350, and a voltage-controlled capacitor 360. The inductor 340, the capacitor bank 350, and the voltage-controlled capacitor 360 may be coupled in parallel, as shown in the example in FIG. 3. However, it is to be appreciated that the LC tank 330 is not limited to this example. The output 164 of the VCO 160 is coupled to the LC tank 330.

The capacitor bank 350 may be used to provide coarse tuning of the frequency of the VCO 160. In some implementations, the capacitor bank 350 includes a bank of switchable capacitors (not shown in FIG. 3), in which a control circuit 370 coupled to the capacitor bank 350 sets the capacitance of the capacitor bank 350 by controlling which ones of the switchable capacitors are switched on. The capacitance of the capacitor bank 350 affects the resonance frequency of the LC tank 330, which determines the frequency of the VCO 160. An exemplary implementation of the capacitor bank 350 is discussed further below with reference to FIG. 4.

The voltage-controlled capacitor 360 is coupled to the input 162 of the VCO 160. The voltage-controlled capacitor 360 is configured to receive the control voltage via the input 162, and set the capacitance of the voltage-controlled capacitor 360 based on the control voltage. In this example, the control voltage controls the capacitance of the voltage-controlled capacitor 360, which controls the resonance frequency of the LC tank 330 (and hence the frequency of the VCO 160). This allows the feedback loop of the PLL 110 to tune the frequency of the VCO 160 by tuning the capacitance of the voltage-controlled capacitor 360 using the control voltage.

In the example in FIG. 3, the voltage-controlled capacitor 360 include a first varactor 364 and a second varactor 366. The first varactor 364 and the second varactor 366 may be coupled in series (e.g., in a back-to-back configuration). In this example, the input 162 of the VCO 160 is coupled between the first varactor 364 and the second varactor 366. Each of the varactors 364 and 366 may be implemented with a metal-oxide-semiconductor (MOS) varactor, a diode, or another type of varactor. It is to be appreciated that the voltage-controlled capacitor 360 may include additional varactors in some implementations.

Figure 4:
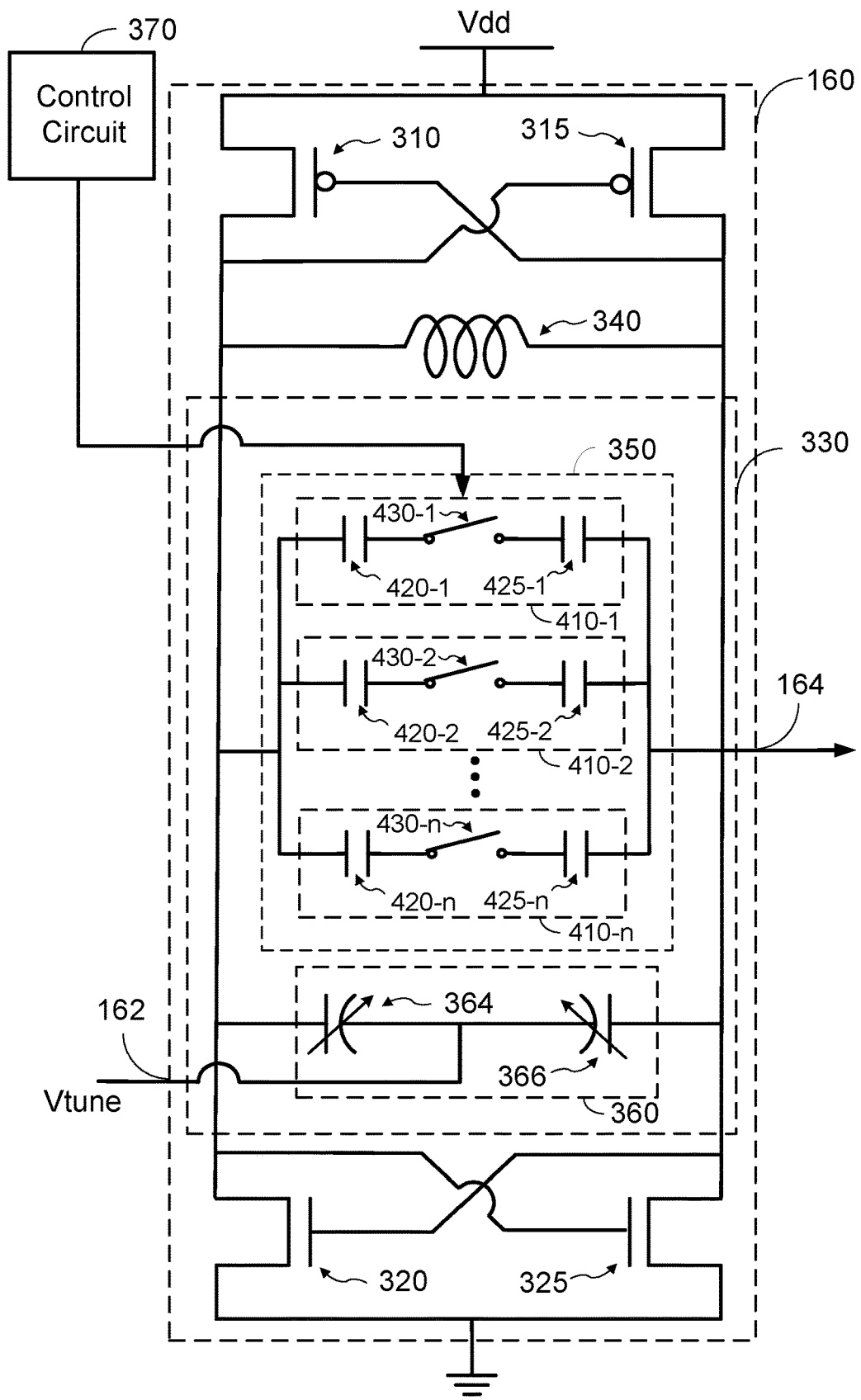
FIG. 4 shows an exemplary implementation of a capacitor bank according to certain aspects of the present disclosure.

FIG. 4 shows an exemplary implementation of the capacitor bank 350 according to certain aspects of the present disclosure. The capacitor bank 350 includes switchable capacitors 410-1 to 410-$n$ coupled in parallel. In this example, the control circuit 370 controls the capacitance of the capacitor bank 350 by controlling which ones of the switchable capacitors 410-1 to 410-$n$ are switched on, as discussed further below.

In the example in FIG. 4, each of the switchable capacitors 410-1 to 410-$n$ includes respective capacitors 420-1 to 420-$n$ and 425-1 to 425-$n$ and a respective switch 430-1 to 430-$n$ coupled in series. In this example, the control circuit 370 switches on a switchable capacitor (i.e., one of the switchable capacitors 410-1 to 410-$n$) by turning on the respective switch (i.e., respective one of the switches 430-1 to 430-$n$), and switches off the switchable capacitor by turning off the respective switch. It is to be appreciated that the individual connections between the control circuit 370 and the switches 430-1 to 430-$n$ are not explicitly shown in FIG. 4 for ease of illustration. In some implementations, the control circuit 370 controls the on/off states of the switches 430-1 to 430-$n$ using codes (e.g., digital codes). For example, each of the codes may include multiple bits, in which each bit corresponds to a respective one of the switchable capacitors 410-1 to 410-$n$, and the bit value of each bit controls whether the respective one of the switchable capacitors is switched on or off. In this example each of the codes has a respective combination of bit values corresponding to a respective capacitance setting of the capacitor bank 350.

It is to be appreciated that the capacitor bank 350 is not limited to the arrangement of capacitors and switches shown in the example in FIG. 4. In general, the capacitor bank 350 may include switchable capacitors (e.g., switchable capacitors 410-1 to 410-$n$) coupled in parallel. Each of the switchable capacitors includes one or more capacitors and one or more switches coupled in series, in which the on/off states of the one or more switches are controlled by the control circuit 370.

In certain aspects, the control circuit 370 performs coarse tuning of the frequency of the VCO 160 (i.e., VCO frequency) during startup of the PLL 110 to set the frequency of the VCO 160 close to a target frequency. During the coarse tuning, the input 162 of the PLL 110 may be coupled to a voltage equal to Vdd/2 (i.e., half the supply voltage). For example, the input 162 of the PLL 110 may be coupled to Vdd/2 through a switch (not shown) that is turned on during the coarse tuning. Thus, in this example, a fixed voltage of Vdd/2 is input to the voltage-controlled capacitor 360 of the VCO 160 during the coarse tuning.

The control circuit 370 performs the coarse tuning of the VCO frequency by tuning the capacitance of the capacitor bank 350. For the example where the control circuit 370 controls the capacitance of the capacitor bank 350 using codes, the control circuit 370 may sequentially try different codes where each code corresponds to a respective capacitance setting of the capacitor bank 350. While trying the different codes, the control circuit 370 senses the VCO frequency to determine the code resulting in the VCO frequency that is closest to the target frequency. After determining the code resulting in the VCO frequency that is closest to the target frequency, the control circuit 370 may set the capacitance of the capacitor bank 350 based on the determined code.

Thus, the coarse tuning sets the frequency of the VCO 160 close to the target frequency by determining the coarse setting (e.g., code) resulting in the VCO frequency that is closest to the target frequency. After the coarse tuning, the feedback loop of the PLL 110 tunes the control voltage (labeled "Vtune") input to the VCO 160 to keep the frequency of the VCO 160 at the target frequency.

Over time, the temperature of the PLL 110 changes (e.g., due to heating). The change in temperature may cause a change in the inductance of the inductor 340, a change in the capacitance of the capacitor bank 350, a change in the capacitance of the voltage-controlled capacitor 360, and/or a change in one or more other components affecting the frequency of the VCO 160. The changes with temperature cause the frequency of the VCO 160 to drift from the target frequency. In response, the feedback loop of the PLL 110 adjusts the control voltage to compensate for the change in the temperature to maintain the VCO frequency at the target frequency.

A challenge with temperature compensation is that the practice of performing coarse tuning with the input 162 of the VCO 160 coupled to Vdd/2 may significantly reduce the portion of the tunable range of the control voltage that is used for temperature compensation. This is because coupling the input 162 of the VCO 160 to Vdd/2 does not take into account the temperature of the PLL 110 at the time of the coarse tuning. This may be demonstrated by way of the following example.

Figure 5A:
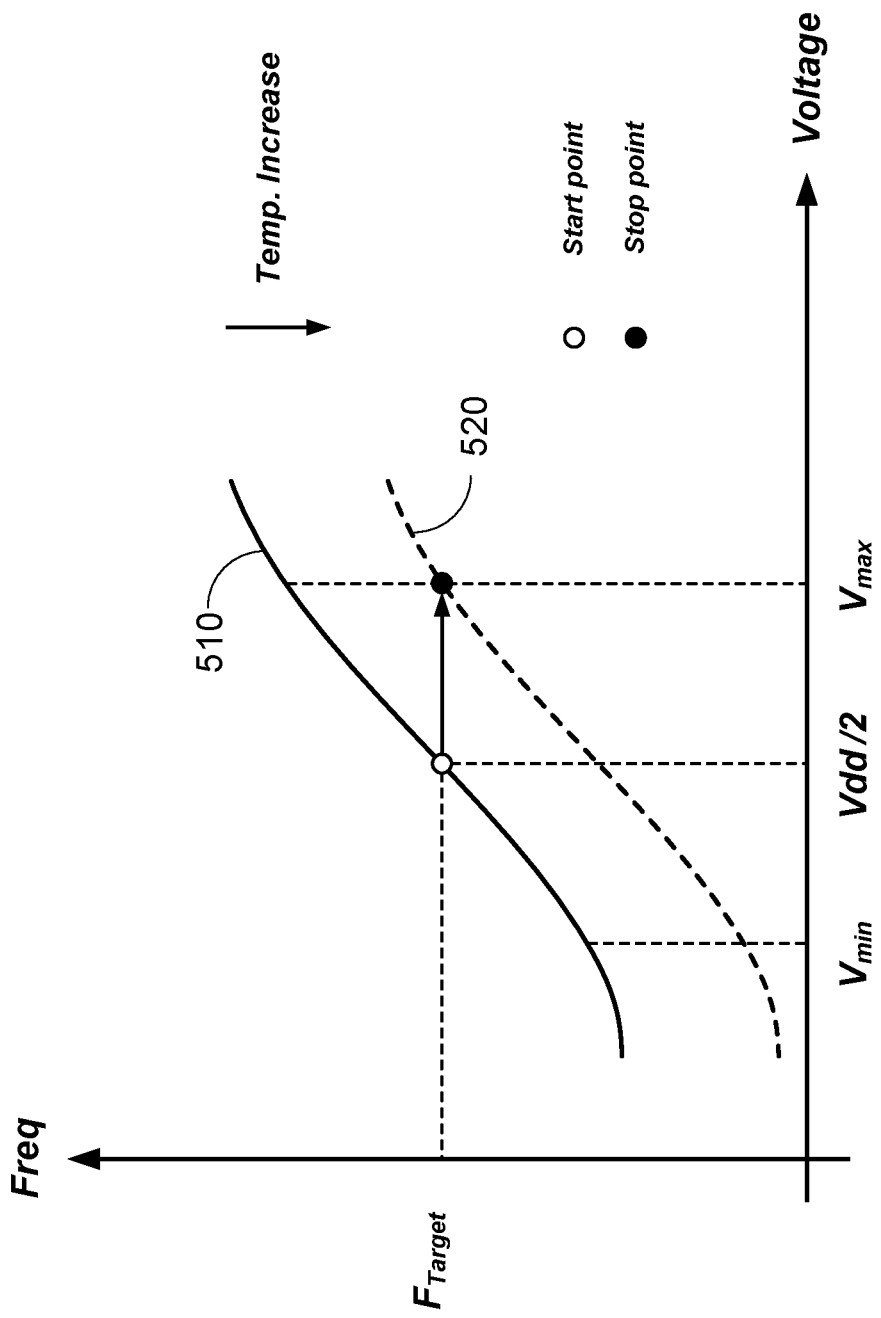
FIG. 5A is a plot illustrating an example of a shift in a frequency versus control voltage curve of the VCO for the case of a cold start according to certain aspects of the present disclosure.

FIG. 5A shows an example of a frequency versus control voltage curve 510 of the VCO 160 for an example of a cold start. FIG. 5A also shows the tunable range of the control voltage, which has a minimum voltage of $V_{min}$ and a maximum voltage of $V_{max}$. In this example, coarse tuning is performed when the PLL 110 is cold. At startup of the PLL 110, the control voltage is approximately equal to Vdd/2 since coarse tuning is performed at Vdd/2.

In this example, the temperature of the PLL 110 gradually increases from the cold start, which causes the frequency versus control voltage curve 520 to shift down as shown in FIG. 5A. As a result, the control voltage needed to maintain the VCO frequency at the target frequency (labeled "$F_{target}$") reaches the maximum voltage of $V_{max}$. If the temperature continues to increase further beyond this point, then the control voltage may no longer be able to keep the VCO frequency at the target frequency.

In this example, only about half the tunable range of the control voltage (i.e., $V_{max}$-Vdd/2) is used for temperature compensation. This is because the control voltage starts at approximately the midpoint of the tunable range (i.e., Vdd/2). Since the PLL 110 starts when the PLL 110 is cold in this example, the temperature increases from the cold start. As a result, approximately half of the tuning range (i.e., Vdd/2-$V_{min}$) of the control voltage is not utilized for temperature compensation. Thus, for the example of the cold start, the effective tunable range of the control voltage for temperature compensation is reduced by approximately half.

Figure 5B:
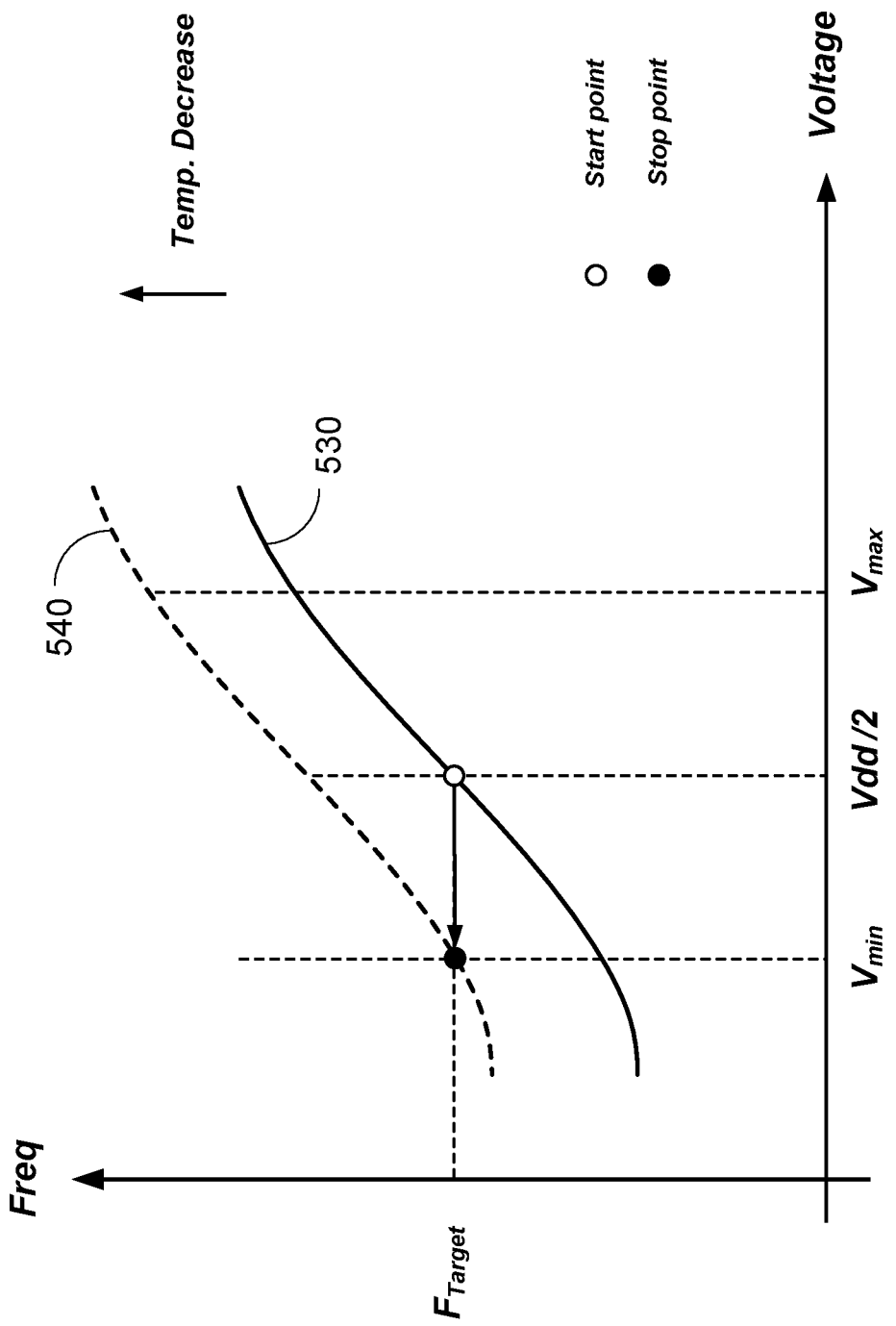
FIG. 5B is a plot illustrating an example of a shift in a frequency versus control voltage curve of the VCO for the case of a hot start according to certain aspects of the present disclosure.

The effective tunable range of the control voltage may also be significantly reduced for the case of a hot start, in which coarse tuning is performed when the PLL 110 is hot and the temperature of the PLL 110 decreases from the hot start. An example of a hot start is shown in FIG. 5B. FIG. 5B shows an example of the frequency vs control voltage curve 530 of the VCO 160 at the startup of the PLL 110 for a hot start. At startup of the PLL 110, the control voltage is approximately equal to Vdd/2 since coarse tuning is performed at Vdd/2.

In this example, the temperature of the PLL 110 gradually decreases from the hot start, which causes the frequency vs control voltage curve 540 to shift up as shown in FIG. 5B. As a result, the control voltage needed to maintain the VCO frequency at the target frequency (labeled "$F_{Target}$") reaches the minimum voltage of $V_{min}$. If the temperature continues to decrease further beyond this point, then the control voltage may no longer be able to keep the VCO frequency at the target frequency.

In this example, only about half the tunable range of the control voltage (i.e., Vdd/2-$V_{min}$) is used for temperature compensation. This is because the control voltage starts at approximately the midpoint of the tunable range (i.e., Vdd/2). Since the PLL 110 starts when the PLL 110 is hot in this example, the temperature decreases from the hot start. As a result, approximately half of the tuning range (i.e., $V_{max}$-Vdd/2) of the control voltage is not utilized for temperature compensation. Thus, for the example of the hot start, the effective tunable range of the control voltage for temperature compensation is reduced by approximately half.

Thus, performing coarse tuning of the VCO 160 with the input 162 coupled to a fixed voltage of Vdd/2 regardless of temperature significantly reduces the portion of the tunable range of the control voltage that is used for temperature compensation. For the case of a cold start or the case of a hot start, the portion of the tunable range of the control voltage that is used for temperature compensation is reduced by approximately half.

To address this, aspects of the present disclosure couple the input 162 of the VCO 160 to a temperature-dependent voltage during coarse tuning instead of a fixed voltage of Vdd/2. The temperature-dependent voltage increases the portion of the tunable range of the control voltage that is used for temperature compensation, as discussed further below.

Figure 6:
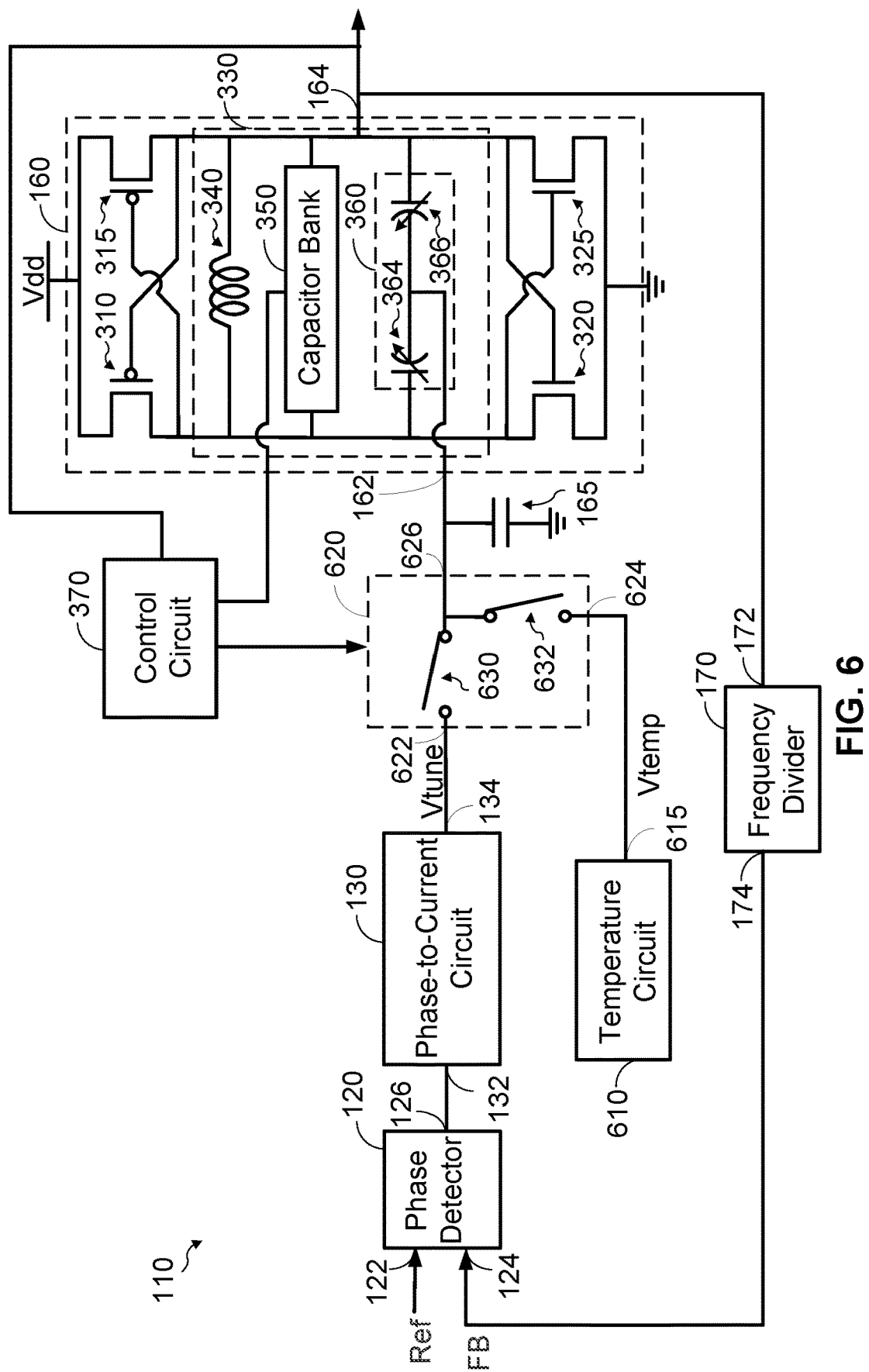
FIG. 6 shows an example of a PLL including a temperature circuit according to certain aspects of the present disclosure.

FIG. 6 shows an example of the PLL 110 further including a temperature circuit 610 and a switching circuit 620 according to certain aspects. The temperature circuit 610 is configured to generate a temperature-dependent voltage (labeled "Vtemp"), and output the temperature-dependent voltage at an output 615. The temperature circuit 610 may include one or more resistors with temperature-dependent resistances (e.g., thermistors), one or more current sources with temperature-dependent currents, and/or one or more other components that are sensitive to temperature. Exemplary implementations of the temperature circuit 610 are discussed below with reference to FIG. 8.

The switching circuit 620 has a first terminal 622, a second terminal 624, and a third terminal 626. The first terminal 622 is coupled to the output 134 of the phase-to-current circuit 130. For the example where the phase-to-current circuit 130 includes the transconductance amplifier 230 (shown in FIGS. 2 and 3), the first terminal 622 is coupled to the output 236 of the transconductance amplifier 230. The second terminal 624 is coupled to the output 615 of the temperature circuit 610. The third terminal 626 is coupled to the input 162 of the VCO 160 (e.g., the voltage-controlled capacitor 360).

The switching circuit 620 is configured to selectively couple the first terminal 622 to the third terminal 626 or couple the second terminal 624 to the third terminal 626 under the control of the control circuit 370. When the switching circuit 620 couples the first terminal 622 to the third terminal 626, the output 134 of the phase-to-current circuit 130 (e.g., the output 236 of the transconductance amplifier 230) is coupled to the input 162 of the VCO 160. When the switching circuit 620 couples the second terminal 624 to the third terminal 626, the output 615 of the temperature circuit 610 is coupled to the input 162 of the VCO 160. Thus, the switching circuit 620 selectively couples the output 134 of the phase-to-current circuit 130 or the output 615 of the temperature circuit 610 to the input 162 of the VCO 160 under the control of the control circuit 370.

In the example in FIG. 6, the switching circuit 620 includes a first switch 630 between the first terminal 622 and the third terminal 626, and a second switch 632 between the second terminal 624 and the third terminal 626. In this example, the on/off states of the switches 630 and 632 are controlled by the control circuit 370. To couple the output 134 of the phase-to-current circuit 130 (e.g., the output 236 of the transconductance amplifier 230) to the input 162 of the VCO 160, the control circuit 370 turns on the first switch 630 and turns off the second switch 632. To couple the output 615 of the temperature circuit 610 to the input 162 of the VCO 160, the control circuit 370 turns off the first switch 630 and turns on the second switch 632. It is to be appreciated that the switching circuit 620 is not limited to the example shown in FIG. 6, and that the switching circuit 620 may be implemented with various arrangements of switches. Each of the switches 630 and 632 may be implemented with a transistor, a transmission gate, or another type of switch.

As discussed above, the control circuit 370 may perform coarse tuning of the frequency of the VCO 160 (i.e., VCO frequency) during startup of the PLL 110 to set the frequency of the VCO 160 close to the target frequency. During the coarse tuning, the control circuit 370 causes the switching circuit 620 to couple the output 615 of the temperature circuit 610 to the input 162 of the VCO 160 in a first mode. Thus, in this example, the temperature-dependent voltage (labeled "Vtemp") is input to the voltage-controlled capacitor 360 (e.g., varactors 364 and 366) instead of a fixed voltage of Vdd/2.

The control circuit 370 performs the coarse tuning of the VCO frequency in the first mode by tuning the capacitance of the capacitor bank 350. For the example where the control circuit 370 controls the capacitance of the capacitor bank 350 using codes, the control circuit 370 may sequentially try different codes where each code corresponds to a respective capacitance setting of the capacitor bank 350. While trying the different codes, the control circuit 370 senses the VCO frequency to determine the code resulting in the VCO frequency that is closest to the target frequency. In this example, the control circuit 370 may be coupled to the output 164 of the VCO 160 to sense the VCO frequency. After determining the code resulting in the VCO frequency that is closest to the target frequency, the control circuit 370 may set the capacitance of the capacitor bank 350 based on the code.

Thus, the coarse tuning sets the frequency of the VCO 160 close to the target frequency by determining the coarse setting (e.g., code) resulting in the VCO frequency that is closest to the target frequency. After the coarse tuning, the control circuit 370 causes the switching circuit 620 to couple the output 134 of the phase-to-current circuit 130 (e.g., the output 236 of the transconductance amplifier 230) to the input 162 of the VCO 160 in a second mode. This allows the feedback loop of the PLL 110 to tune the control voltage (labeled "Vtune") input to the VCO 160 to keep the frequency of the VCO 160 at the target frequency.

Thus, the control circuit 370 applies the temperature-dependent voltage (labeled "Vtemp") to the input 162 of the VCO 160 (e.g., the voltage-controlled capacitor 360) during coarse tuning instead of a fixed voltage of Vdd/2. Applying the temperature-dependent voltage to the input 162 of the VCO 160 during coarse tuning increases the portion of the tunable range of the control voltage that is used for temperature compensation, allowing the PLL 110 to compensate for temperature over a wider temperature range. This may be demonstrated by way of the following example.

Figure 7A:
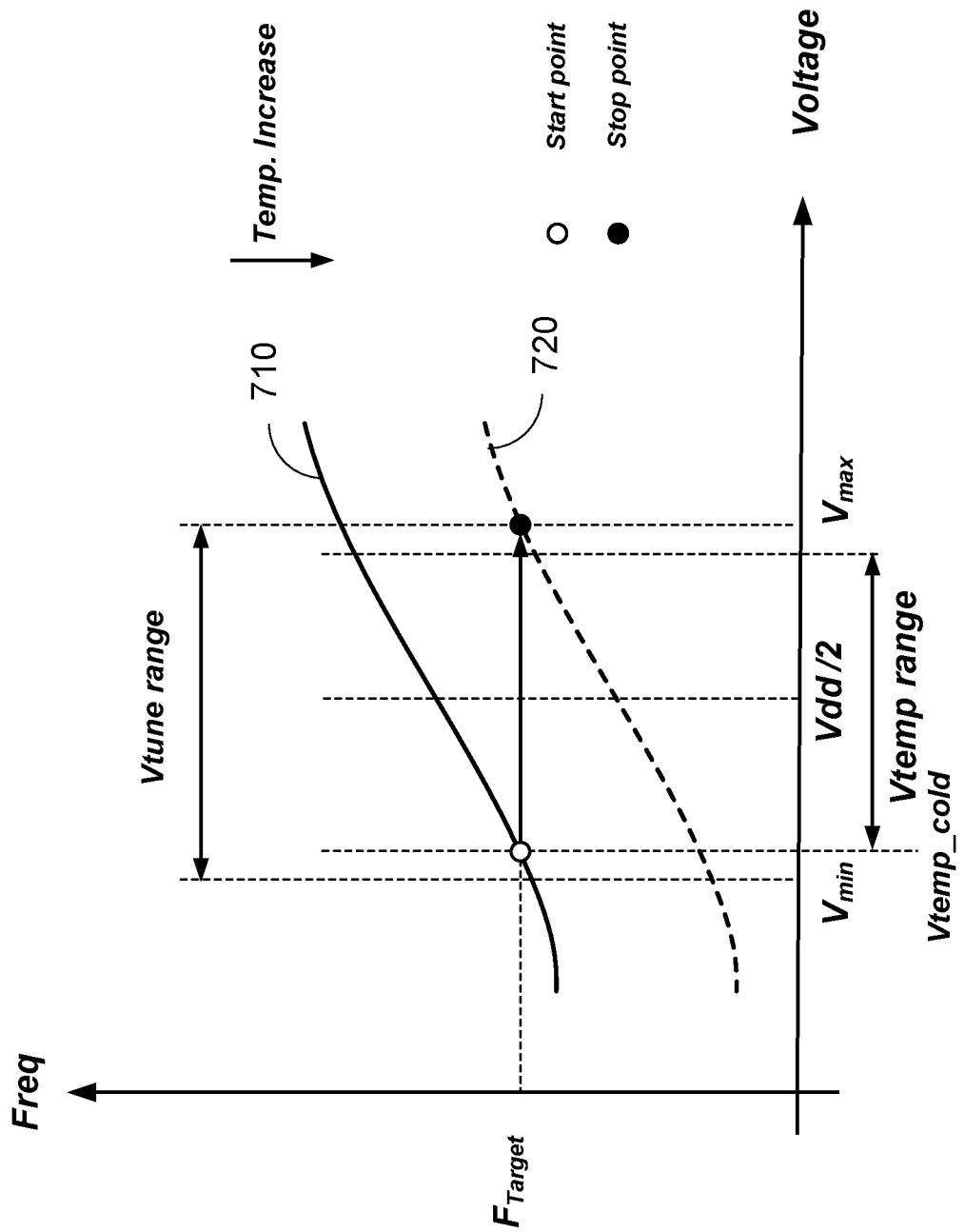
FIG. 7A is a plot illustrating another example of a shift in a frequency versus control voltage curve of the VCO for the case of a cold start according to certain aspects of the present disclosure.

FIG. 7A shows an example of a frequency versus control voltage curve 710 of the VCO 160 for an example of a cold start. In this example, coarse tuning is performed when the PLL 110 is cold. During the coarse tuning, the temperature-dependent voltage from the temperature circuit 610 (labeled "Vtemp_cold") is close to the minimum voltage of the control voltage since the PLL 110 is cold during the coarse tuning. As shown in FIG. 7A, the temperature-dependent voltage for the cold start is well below the voltage of Vdd/2, which is used as the starting point for the previous approach regardless of temperature.

In this example, the temperature of the PLL 110 gradually increases from the cold start, which causes the frequency versus control voltage curve 720 to shift down as shown in FIG. 7A. As a result, the control voltage needed to maintain the VCO frequency at the target frequency (labeled "$F_{Target}$") increases. Because the control voltage starts at a lower voltage (i.e., Vtemp_cold) compared with FIG. 5A, the PLL 110 is able to tune the control voltage over a much wider range (i.e., $V_{max}$–Vtemp_cold) to provide temperature compensation compared with FIG. 5A, in which only approximately half the tunable range is used for temperature compensation.

Figure 7B:
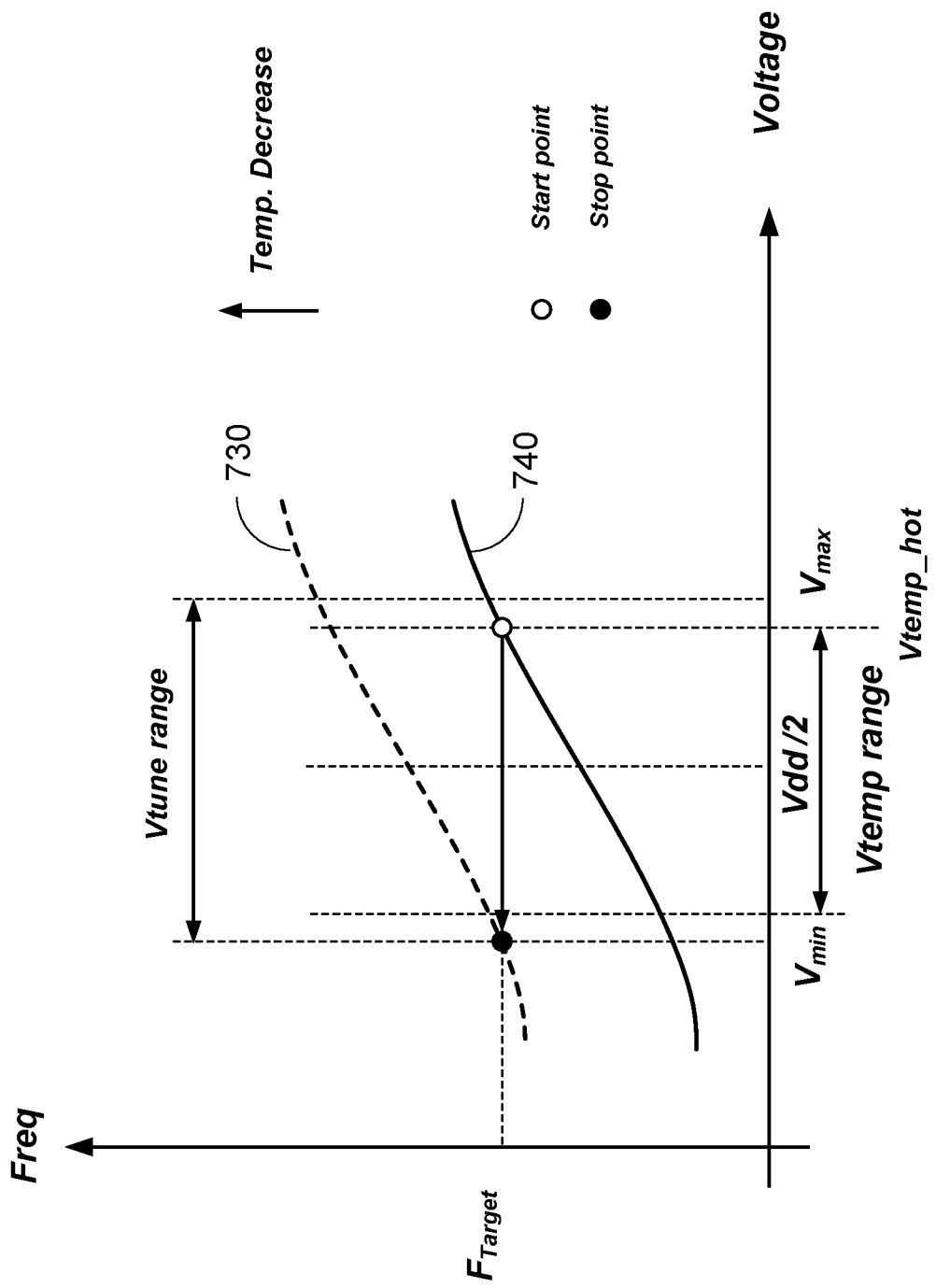
FIG. 7B is a plot illustrating another example of a shift in a frequency versus control voltage curve of the VCO for the case of a hot start according to certain aspects of the present disclosure.

FIG. 7B shows an example of a frequency vs control voltage curve 730 of the VCO 160 for an example of a hot start. In this example, coarse tuning is performed when the PLL 110 is hot. During the coarse tuning, the temperature-dependent voltage from the temperature circuit 610 (labeled "Vtemp_hot") is close to the maximum voltage of the control voltage since the PLL 110 is hot during the coarse tuning. As shown in FIG. 7B, the temperature-dependent voltage for the hot start is well above the voltage of Vdd/2, which is used as the starting point for the previous approach regardless of temperature.

In this example, the temperature of the PLL 110 gradually decreases from the hot start, which causes the frequency vs control voltage curve 740 to shift up as shown in FIG. 7B. As a result, the control voltage needed to maintain the VCO frequency at the target frequency (labeled "$F_{Target}$") decreases. Because the control voltage starts at a higher voltage (i.e., Vtemp_hot) compared with FIG. 5B, the PLL 110 is able to tune the control voltage over a much wider range (i.e., Vtemp_hot–$V_{min}$) to provide temperature compensation compared with FIG. 5B, in which only approximately half the tunable range is used for temperature compensation.

In the above examples, the control circuit 370 couples the temperature circuit 610 to the input 162 of the VCO 160 during coarse tuning, and decouples the temperature circuit 610 from the input 162 of the VCO 160 during operation of the PLL 110 when the feedback loop tunes the control voltage to maintain the VCO frequency at the target frequency. Because the temperature circuit 610 is decoupled from the input 162 of the VCO 160 during operation of the PLL 110, noise on the temperature-dependent voltage does not impact the phase noise performance of the PLL 110 during operation. As a result, the temperature circuit 610 does not require a large resistor-capacitor (RC) filter for noise reduction.

Further, in the above examples, the temperature-dependent voltage may be applied to the same varactors 364 and 366 that are used for the control voltage without the need for separate temperature varactors for temperature compensation. Not using separate temperature varactors helps avoid difficulties associated with the use of separate temperature varactors such as extensive characterization in a lab to optimize settings for the temperature varactors.

In the example in FIG. 6, the capacitor 165 is coupled between the third terminal 626 of the switching circuit 620 and the input 162 of the VCO 160. Placing the capacitor 165 between the switching circuit 620 and the VCO 160 reduces the settling time of the PLL 110 after the feedback loop of the PLL 110 is closed. This is because, during coarse tuning, the temperature circuit 610 charges the capacitor 165 to the temperature-dependent voltage. As a result, when the feedback loop of the PLL 110 is closed after coarse tuning, the initial voltage on the capacitor 165 is approximately equal to the temperature-dependent voltage (e.g., instead of zero volts). After the PLL 110 is locked, the control voltage Vtune deviates from the initial voltage set by the temperature-dependent voltage by a small amount (e.g., <0.1V), which may depend on the VCO gain and the residual error after coarse tuning. Because of the small difference between the initial voltage set by the temperature-dependent voltage and the control voltage after lock, the settling time of the PLL 110 is substantially reduced.

The temperature circuit 610 may be implemented with a proportional to absolute temperature (PTAT) circuit where the temperature-dependent voltage increases with an increase in temperature. Alternatively, the temperature circuit 610 may be implemented with a conversely proportional to absolute temperature (CTAT) circuit where the temperature-dependent voltage decreases with an increase in temperature.

Figure 8:
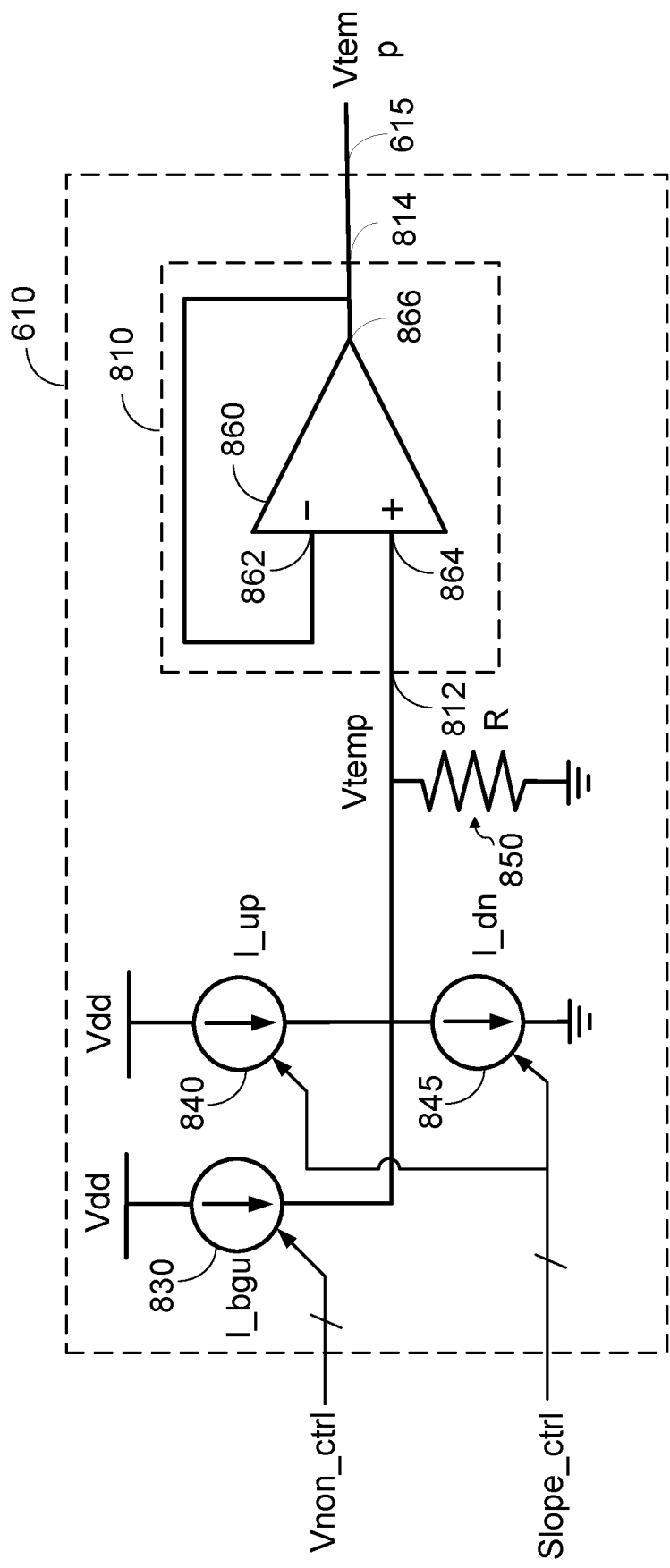
FIG. 8 shows an exemplary implementation of a temperature circuit according to certain aspects of the present disclosure.

FIG. 8 shows an exemplary implementation of the temperature circuit 610 according to certain aspects. In this example, the temperature circuit 610 includes a buffer 810, a first current source 830, a second current source 840, a third current source 845, and a resistor 850. The buffer 810 may be a unity-gain buffer or another type of buffer. The buffer 810 has an input 812, and an output 814 coupled to the output 615 of the temperature circuit 610.

The first current source 830 is coupled between the supply rail and the input 812 of the buffer 810, the second current source 840 is coupled between the supply rail and the input 812 of the buffer 810, and the third current source 845 is coupled between the input 812 of the buffer 810 and ground. The resistor 850 is coupled between the input 812 of the buffer 810 and ground or some other reference voltage.

In certain aspects, the first current source 830 is configured to generate a first current (labeled "I_bgu") that is approximately independent of temperature. The first current source 830 may be implemented, for example, using a bandgap circuit (not shown) and a resistor (not shown). In this example, the bandgap circuit generates a bandgap voltage that is insensitive to temperature, in which the bandgap voltage is applied across the resistor to generate the first current. However, it is to be appreciated that the present disclosure is not limited to this example.

The second current source 840 is configured to generate a second current (labeled "I_up") that is supplied to the resistor 850, and the third current source 840 is configured to generate a third current (labeled "I_dn") that is drawn away from the resistor 850. In this example, the voltage across the resistor 850 provides the temperate-dependent voltage, which may be given by:

$$Vtemp = R \cdot I\_bgu + R \cdot (I\_up - I\_dn) \quad (1)$$

where R is the resistance of the resistor 850. The temperature-dependent voltage is applied to the input 812 of the buffer. For the example where the buffer 810 is a unity-gain buffer, the buffer 810 outputs the temperature-dependent voltage at the output 814 (and hence the output 615 of the temperature circuit 610). In this example, the buffer 810 helps isolate the resistor 850 and the current sources 830, 840, and 845 at the input 812 of the buffer 810 from the loading at the output 615 of the temperature circuit 610.

In this example, the temperature circuit 610 generates a temperature-dependent voltage that is approximately a linear function of temperature based on equation (1). In some implementations, the first current source 830 may be used to set the temperature-dependent voltage at a reference temperature (e.g., 25C), and the second current source 840 and/or the third current source 845 may be used to set the slope of the temperature-dependent voltage over temperature, as discussed further below.

For example, the second current source 840 and the third current source 845 may be configured such that the second current (labeled "I_up) and the third current (labeled "I_dn") are equal at the reference temperature (e.g., 25 C). As a result, the temperature-dependent voltage at the reference temperature is given by:

$$Vtemp\_ref = R \cdot I\_bgu \quad (2)$$

where Vtemp_ref is the temperature-dependent voltage at the reference temperature (e.g., 25C). Thus, in this example, the voltage-dependent voltage at the reference temperature is a function of the current level of the first current (labeled "I_bgu") and the resistance of the resistor 850. In one example, the current level of the first current source 830 is controlled by a first digital control signal (labeled "Vnon_ctrl") from the control circuit 370 (not shown in FIG. 8). In this example, the control circuit 370 may set the temperature-dependent voltage at the reference temperature by setting the current level of the first current (labeled "I_bgu") accordingly.

The slope of the temperature-dependent voltage may be positive or negative over temperature. For a positive slope (i.e., upward slope), the second current source 840 may be implemented with a PTAT current source and the third current source 845 may be implemented with a constant current source in which the third current (labeled "I_dn") is approximately constant over temperature. In this example, the second current (labeled "I_up") from the second current source 840 increases with an increase in temperature, which causes the temperature-dependent voltage to have a positive slope over temperature. The positive slope is a function of the current level of the second current (labeled "I_up") over temperature and the resistance of the resistor 850. In one example, the current level of the second current source 840 over temperature is controlled by a second digital control signal (labeled "Slope_ctrl") from the control circuit 370 (not shown in FIG. 8). In this example, the control circuit 370 may set the positive slope of the temperature-dependent voltage by setting the current level of the second current (labeled "I_up") over temperature accordingly.

For a negative slope (i.e., downward slope), the third current source 845 may be implemented with a PTAT current source and the second current source 840 may be implemented with constant current source in which the second current (labeled "I_up") is approximately constant over temperature. In this example, the third current (labeled "I_dn") from the third current source 845 increases with an increase in temperature, which causes the temperature-dependent voltage to have a negative slope over temperature since the third current draws current away from the resistor 850. The negative slope is a function of the current level of the third current (labeled "I_dn") over temperature and the resistance of the resistor 850. In one example, the current level of the third current source 845 over temperature is controlled by the second digital control signal (labeled "Slope_ctrl") from the control circuit 370 (not shown in FIG. 8). In this example, the control circuit 370 may set the negative slope of the temperature-dependent voltage by setting the current level of the third current (labeled "I_dn") over temperature accordingly.

The second digital control signal may be input to the second current source 840, the third current source 845, or both to control the slope of the temperature-dependent voltage.

In the example in FIG. 8, the buffer 810 includes an amplifier 860 having a first input 862, a second input 864, and an output 866 coupled to the output 814 of the buffer 810 (and hence the output 615 of the temperature circuit 610). In this example, the output 866 is coupled to the first input 862 to provide unity voltage gain. Thus, in this example, the amplifier 860 acts as a unity-gain buffer. The second input 864 is coupled to the input 812 of the buffer 810.

Figure 9A:
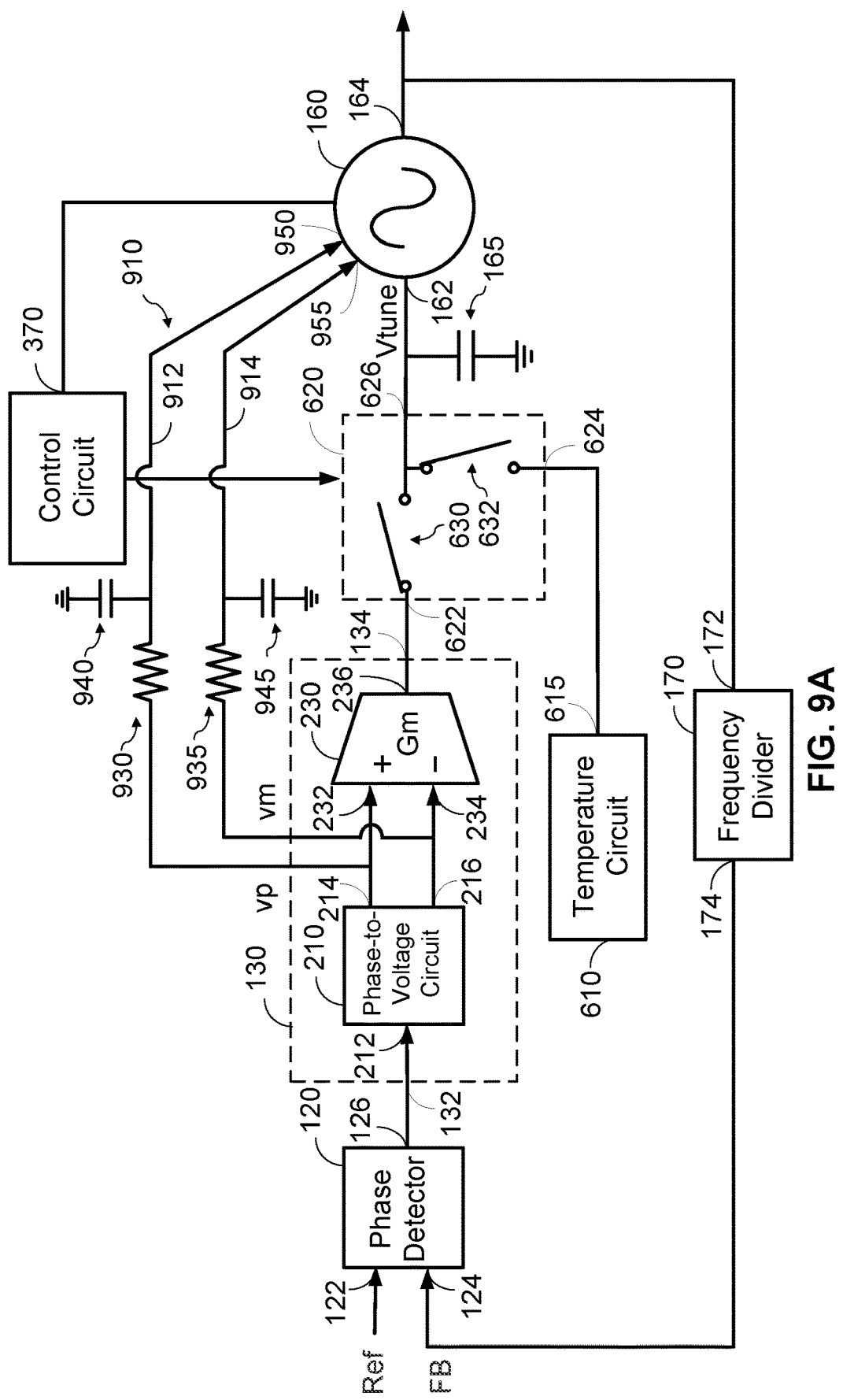
FIG. 9A shows an example of a dual-loop PLL according to certain aspects of the present disclosure.
Figure 9B:
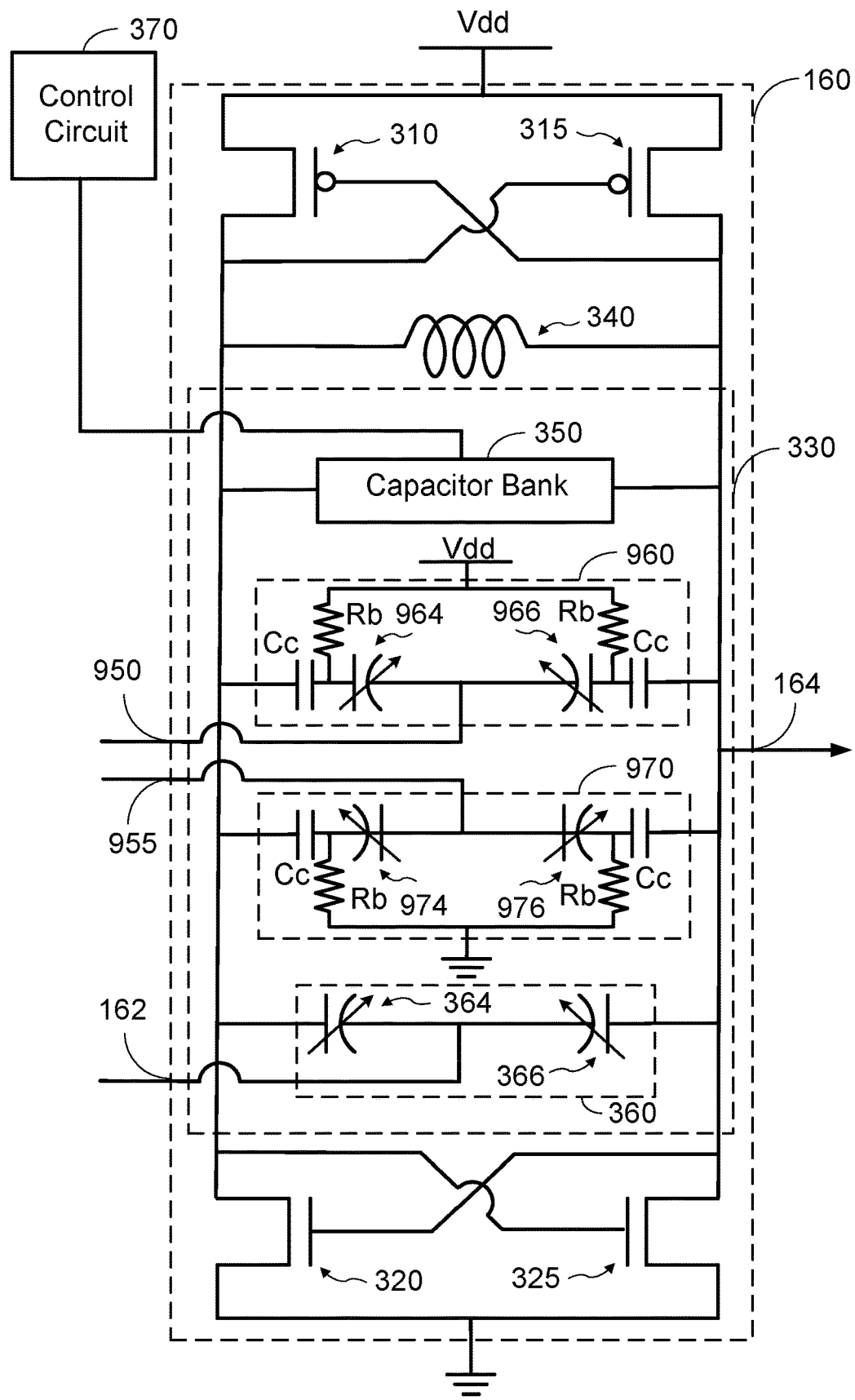
FIG. 9B shows an example of a VCO including multiple voltage-controlled capacitors according to certain aspects of the present disclosure.

FIGS. 9A and 9B show an example in which the PLL 110 further includes a differential proportional path 910 according to certain aspects. In this example, the differential proportional path 910 includes a first signal path 912 and a second signal path 914, in which the first signal path 912 is between the first output 214 of the phase-to-voltage circuit 210 and a second input 950 of the VCO 160, and the second signal path 914 is between the second output 216 of the phase-to-voltage circuit 210 and a third input 955 of the VCO 160.

As shown in FIG. 9B, the LC tank 330 in the VCO 160 may further include a second voltage-controlled capacitor 960 coupled to the first signal path 912 via the second input 950, and a third voltage-controlled capacitor 970 coupled to the second signal path 914 via the third input 955. In the discussion below, the input 162 may be referred to as the first input and the voltage-controlled capacitor 360 may be referred to as the first voltage-controlled capacitor 360.

In the example shown in FIG. 9A, the first signal path 912 includes a first resistor 930 and a first capacitor 940 to provide a low-pass filter (also referred to as an RC network), in which the first resistor 930 is between the first output 214 of the phase-to-voltage circuit 210 and the second input 950 of the VCO 160, and the first capacitor 940 is between the second input 950 of the VCO 160 and ground. The second signal path 914 includes a second resistor 935 and a second capacitor 945 to provide a low-pass filter, in which the second resistor 935 is between the second output 216 of the phase-to-voltage circuit 210 and the third input 955 of the VCO 160, and the second capacitor 945 is between the third input 955 of the VCO 160 and ground.

In this example, the first signal path 912 receives the first voltage (labeled "vp") from the phase-to-voltage circuit 210, low-pass filters the first voltage, and provides the first voltage after filtering to the second input 950 of the VCO 160. The second signal path 914 receives the second voltage (labeled "vm") from the phase-to-voltage circuit 210, low-pass filters the second voltage, and provides the second voltage after filtering to the third input 955 of the VCO 160. In this example, the first voltage is input to the second voltage-controlled capacitor 960 (shown in FIG. 9B) after filtering to tune the capacitance of the second voltage-controlled capacitor 960, and the second voltage is input to the third voltage-controlled capacitor 970 (shown in FIG. 9B) after filtering to tune the capacitance of the third voltage-controlled capacitor 970.

In this example, the path including the capacitor 165 provides the PLL 110 with an integral path since the capacitor 165 integrates the current from the transconductance amplifier 230 to generate the control voltage (labeled "Vtune"). Thus, in this example, the PLL 110 is a dual-path PLL including the integral path and the differential proportional path 910. The differential proportional path 910 provides fast phase correction while the integral path provides frequency correction.

In this example, the bandwidth of the PLL 110 is predominately controlled by the gain of the proportional path 910. As a result, the gain of the integral path has little to no impact on the bandwidth of the PLL 110. As discussed above, the control voltage on the integral path may vary over a relatively large tunable range to provide temperature compensation. The relatively large tunable range of the control voltage may make it difficult to keep the gain on the integral path linear over the tunable range (and hence temperature). However, since the PLL bandwidth is predominately controlled by the gain of the proportional path 910, non-linearity in the gain of the integral path has little to no impact on the PLL bandwidth.

In the example shown in FIG. 9B, the second voltage-controlled capacitor 960 includes a first varactor 964 and a second varactor 966. The first varactor 964 and the second varactor 966 may be coupled in series (e.g., in a back-to-back configuration). In this example, the second input 950 of the VCO 160 is coupled between the first varactor 964 and the second varactor 966. Each of the varactors 964 and 966 may be implemented with a metal-oxide-semiconductor (MOS) varactor, a diode, or another type of varactor. In the example shown in FIG. 9B, the varactors 964 and 966 are biased by the supply voltage Vdd via bias resistors Rb. The varactors 964 and 966 are also AC coupled with the inductor 340 vias coupling capacitors Cc. It is to be appreciated that the second voltage-controlled capacitor 960 may include additional varactors in some implementations.

Also, in this example, the third voltage-controlled capacitor 970 includes a first varactor 974 and a second varactor 976. The first varactor 974 and the second varactor 976 may be coupled in series (e.g., in a back-to-back configuration). In this example, the third input 955 of the VCO 160 is coupled between the first varactor 974 and the second varactor 976. Each of the varactors 974 and 976 may be implemented with a metal-oxide-semiconductor (MOS) varactor, a diode, or another type of varactor. In the example shown in FIG. 9B, the varactors 974 and 976 have opposite polarity with respect to the varactors 964 and 966 since the proportional path 910 is differential in this example. In this example, the varactors 974 and 976 are biased at ground potential via bias resistors Rb. The varactors 974 and 976 are also AC coupled with the inductor 340 vias coupling capacitors Cc. It is to be appreciated that the third voltage-controlled capacitor 970 may include additional varactors in some implementations.

Figure 10:
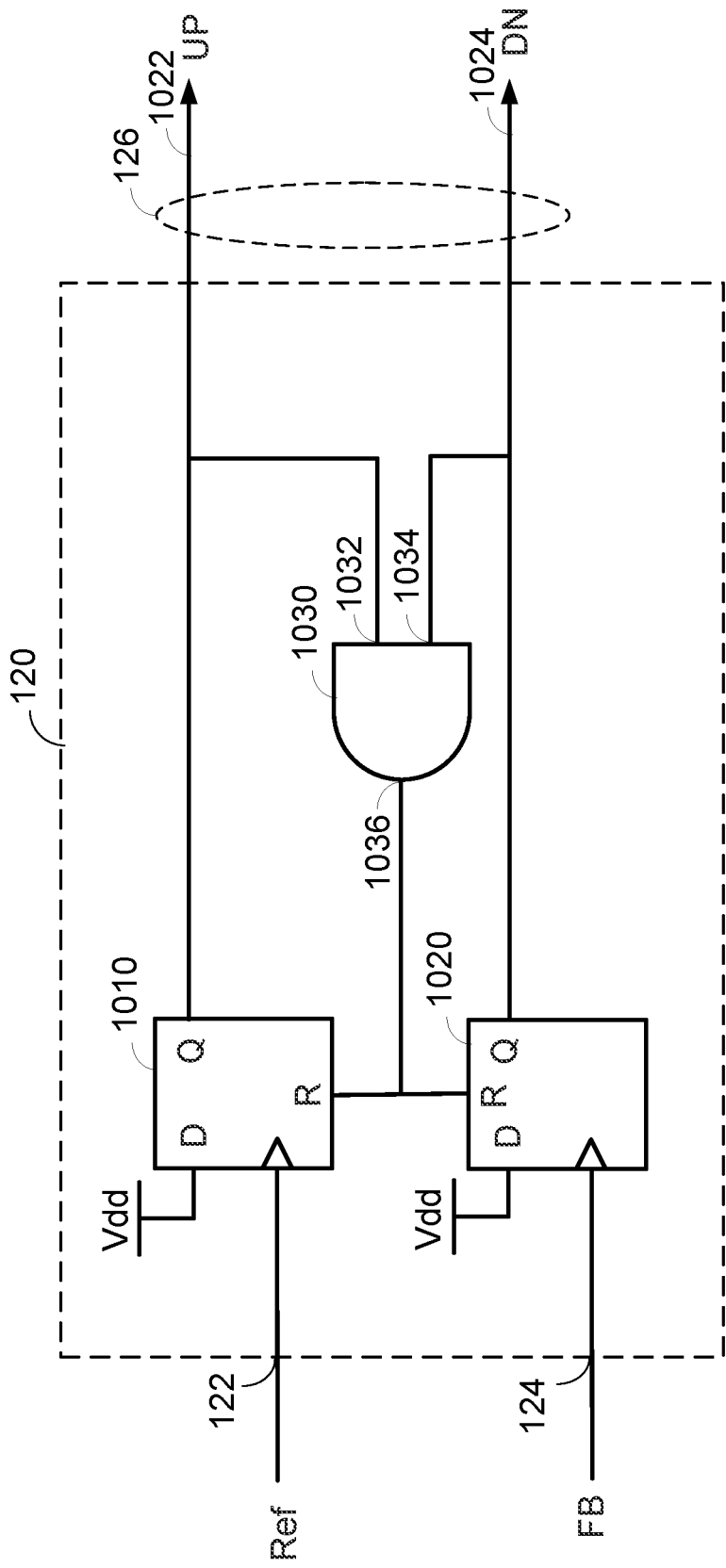
FIG. 10 shows an exemplary implementation of a phase detector according to certain aspects of the present disclosure.

FIG. 10 shows an exemplary implementation of the phase detector 120 according to certain aspects. In this example, the phase detector 120 includes a first flip-flop 1010, a second flip-flop 1020, and an AND gate 1030. Also, in this example, the output 126 of the phase detector 120 includes a first output 1022 and a second output 1024.

The first flip-flop 1010 has a clock input coupled to the first input 122 of the phase detector 120, an input (labeled "D") coupled to the supply rail, an output (labeled "Q") coupled to the first output 1022 of the phase detector 120, and a reset input (labeled "R"). The second flip-flop 1020 has a clock input coupled to the second input 124 of the phase detector 120, an input (labeled "D") coupled to the supply rail, an output (labeled "Q") coupled to the second output 1024 of the phase detector 120, and a reset input (labeled "R"). The AND gate 1030 has a first input 1032 coupled to the output of the first flip-flop 1010, a second input 1034 coupled to the output of the second flip-flop 1020, and an output 1036 coupled to the reset input of the first flip-flop 1010 and the reset input of the second flip-flop 1020.

In this example, the phase detector 120 outputs an up signal (labeled "UP") at the first output 1022 and a down signal (labeled "DN") at the second output 1024. The up signal and the down signal indicate whether the reference signal leads or lags the feedback signal, as discussed further below.

When the reference signal leads the feedback signal, the rising edge of the reference signal arrives at the clock input of the first flip-flop 1010 before the rising edge of the feedback signal arrives at the clock input of the second flip-flop 1020. In this case, the output of the first flip-flop 1010 goes high when the rising edge of the reference signal arrives at the clock input of the first flip-flop 1010. When the rising edge of the feedback signal arrives at the clock input of the second flip-flop 1020, the output of the second flip-flop 1020 goes high. When this occurs, both inputs 1032 and 1034 of the AND gate 1030 are high, which causes the output of the AND gate 1030 to reset the first flip-flop 1010 and the second flip-flop 1020. The reset causes the outputs of both flip-flops 1010 and 1020 to return low. Thus, in this example, the first flip-flop 1010 outputs a positive pulse for the up signal, in which the width of the positive pulse is approximately equal to the time delay between the rising edge of the reference signal and the rising edge of the feedback signal.

When the reference signal lags the feedback signal (i.e., the feedback signal leads the reference signal), the rising edge of the feedback signal arrives at the clock input of the second flip-flop 1020 before the rising edge of the reference signal arrives at the clock input of the first flip-flop 1010. In this case, the output of the second flip-flop 1020 goes high when the rising edge of the feedback signal arrives at the clock input of the second flip-flop 1020. When the rising edge of the reference signal arrives at the clock input of the first flip-flop 1010, the output of the first flip-flop 1010 goes high. When this occurs, both inputs 1032 and 1034 of the AND gate 1030 are high, which causes the output of the AND gate 1030 to reset the first flip-flop 1010 and the second flip-flop 1020. The reset causes the outputs of both flip-flops 1010 and 1020 to return low. Thus, in this example, the second flip-flop 1020 outputs a positive pulse for the down signal, in which the width of the positive pulse is approximately equal to the time delay between the rising edge of the feedback signal and the rising edge of the reference signal.

Figure 11:
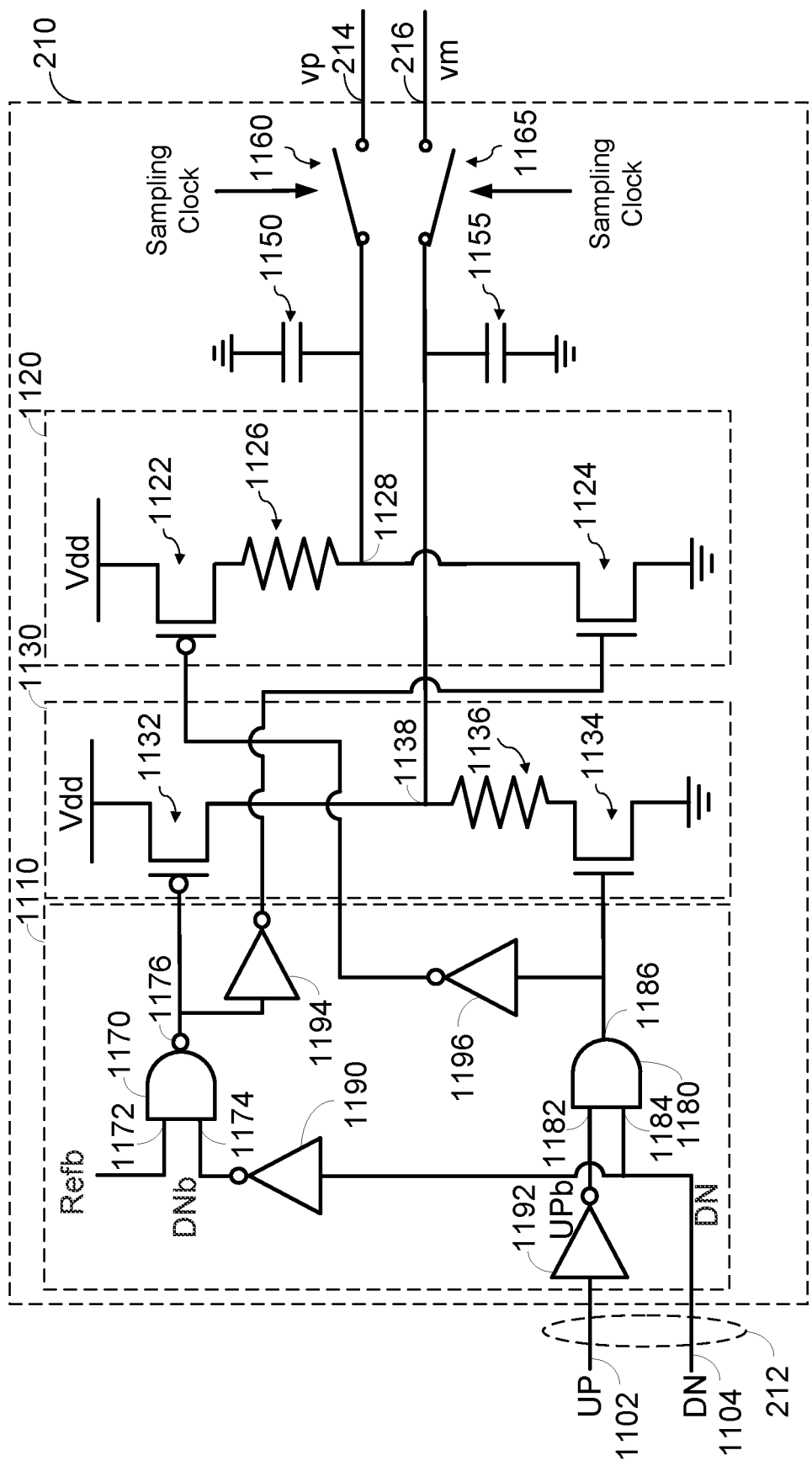
FIG. 11 shows an exemplary implementation of a phase-to-voltage circuit according to certain aspects of the present disclosure.

FIG. 11 shows an exemplary implementation of the phase-to-voltage circuit 210 according to certain aspects. In this example, the phase-to-voltage circuit 210 includes a first driver 1120, a second driver 1130, a pre-drive circuit 1110, a first sampling switch 1160, a second sampling switch 1165, a first capacitor 1150, and a second capacitor 1155.

The first driver 1120 includes a pull-up transistor 1122, a pull-down transistor 1124, and a resistor 1126 between the pull-up transistor 1122 and the pull-down transistor 1124. The pull-up transistor 1122 (e.g., PFET) has a source coupled to the supply rail and a drain coupled to the resistor 1126. The pull-down transistor 1124 (e.g., NFET) has a drain coupled to the resistor 1126, and a source coupled to ground. The first driver 1120 has an output node 1128 between the resistor 1126 and the drain of the pull-down transistor 1124. The first capacitor 1150 is coupled to the output node 1128, and the first sampling switch 1160 is coupled between the output node 1128 and the first output 214 of the phase-to-voltage circuit 210.

The second driver 1130 includes a pull-up transistor 1132, a pull-down transistor 1134, and a resistor 1136 between the pull-up transistor 1132 and the pull-down transistor 1134. The pull-up transistor 1132 (e.g., PFET) has a source coupled to the supply rail and a drain coupled to the resistor 1136. The pull-down transistor 1134 (e.g., NFET) has a drain coupled to the resistor 1136, and a source coupled to ground. The second driver 1130 has an output node 1138 between the resistor 1136 and the drain of the pull-up transistor 1132. The second capacitor 1155 is coupled to the output node 1138, and the second sampling switch 1165 is coupled between the output node 1138 and the second output 216 of the phase-to-voltage circuit 210.

The first sampling switch 1160 and the second sampling switch 1165 are driven by a sampling clock signal. During each period (i.e., cycle) of the sampling clock signal, the first sampling switch 1160 and the second sampling switch 1165 turn on to sample the voltage at the output nodes 1128 and 1138, respectively, and output the sampled voltages at the first and second outputs 214 and 216, respectively, of the phase-to-voltage circuit 210. For example, the sampling clock signal may turn on the sampling switches 1160 and 1165 when the sampling clock signal is high and turn off the sampling switches 1160 and 1165 when the sampling clock signal is low, or vice versa.

In this example, the input 212 of the phase-to-voltage circuit 210 includes a first input 1102 and a second input 1104. The first input 1102 is coupled to the first output 1022 of the phase detector 120 to receive the up signal, and the second input 1104 is coupled to the second output 1024 of the phase detector 120 to receive the down signal. The pre-drive circuit 1110 is configured to receive the up signal and the down signal from the phase detector 120, and drive the first driver 1120 and the second driver 1130 based on the up signal and the down signal, as discussed further below.

In the example in FIG. 11, the pre-drive circuit 1110 includes a NAND gate 1170, an AND gate 1180, a first inverter 1190, a second inverter 1192, a third inverter 1194, and a fourth inverter 1196. The NAND gate 1170 has a first input 1172, a second input 1174, and an output 1176. The first input 1172 is configured to receive an inverse of the reference signal (labeled "Refb"), which may be obtained by inverting the reference signal with an inverter (not shown). The first inverter 1190 is coupled between the second input 1104 and the second input 1174 of the NAND gate 1170. As a result, the second input 1174 of the NAND gate 1170 receives the inverse of the down signal (labeled "DNb"). The output 1176 of the NAND gate 1170 is coupled to the gate of the pull-up transistor 1132 in the second driver 1130. The third inverter 1194 is coupled between the output 1176 of the NAND gate 1170 and the gate of the pull-down transistor 1124 in the first driver 1120.

The AND gate 1180 has a first input 1182, a second input 1184, and an output 1186. The second inverter 1192 is coupled between the first input 1102 and the first input 1182 of the AND gate 1180. As a result, the first input 1182 of the AND gate 1180 receives the inverse of the up signal (labeled "UPb"). The second input 1184 of the AND gate 1180 is coupled to the second input 1104 to receive the down signal. The output 1186 of the AND gate 1180 is coupled to the gate of the pull-down transistor 1134 in the second driver 1130. The fourth inverter 1196 is coupled between the output 1186 of the AND gate 1180 and the gate of the pull-up transistor 1122 in the first driver 1120.

During each phase (i.e., cycle) of the reference signal, when the reference signal is low and the down signal is low, the NAND gate 1170 turns on the pull-up transistor 1132 in the second driver 1130, and the NAND gate 1170 and the third inverter 1194 turn on the pull-down transistor 1124 in the first driver 1120. This causes the pull-up transistor 1132 to pull the output node 1138 of the second driver 1130 high, and the pull-down transistor 1124 in the first driver 1120 to pull the output node 1128 low.

When the reference signal leads the feedback signal, the inverse up signal goes low, which causes the AND gate 1180 to leave the pull-down transistor 1134 in the second driver 1130 turned off and the pull-up transistor 1122 in the first driver 1120 turned off. In this case, the output node 1138 of the second driver 1130 stays high (e.g., Vdd) and the output node 1128 of the first driver 1120 stays low. As a result, the first sampling switch 1160 samples the low voltage at the output node 1128, which is output at the first output 214. The second sampling switch 1165 samples the high voltage (e.g., Vdd) at the output node 1138, which is output at the second output 216.

When the reference signal lags the feedback signal (i.e., the feedback signal leads the reference signal), the inverse up signal stays high and the down signal goes high, which causes the AND gate 1180 to turn on the pull-down transistor 1134 in the second driver 1130 and turn on the pull-up transistor 1122 in the first driver 1120. In this case, the voltage at the output node 1138 of the second driver 1130 ramps down at a rate based on an RC time constant of the resistor 1136 and the second capacitor 1155. The voltage at the output node 1128 of the first driver 1120 ramps up at a rate based on an RC time constant of the resistor 1126 and the first capacitor 1150. The first sampling switch 1160 then samples the voltage at the output node 1128 and the second sampling switch 1165 samples the voltage at the output node 1138 (e.g., when the sampling clock signal goes high). The sampled voltages at the output nodes 1128 and 1138 are output at the first output 214 and the second output 216, respectively, of the phase-to-voltage circuit 210.

Figure 12A:
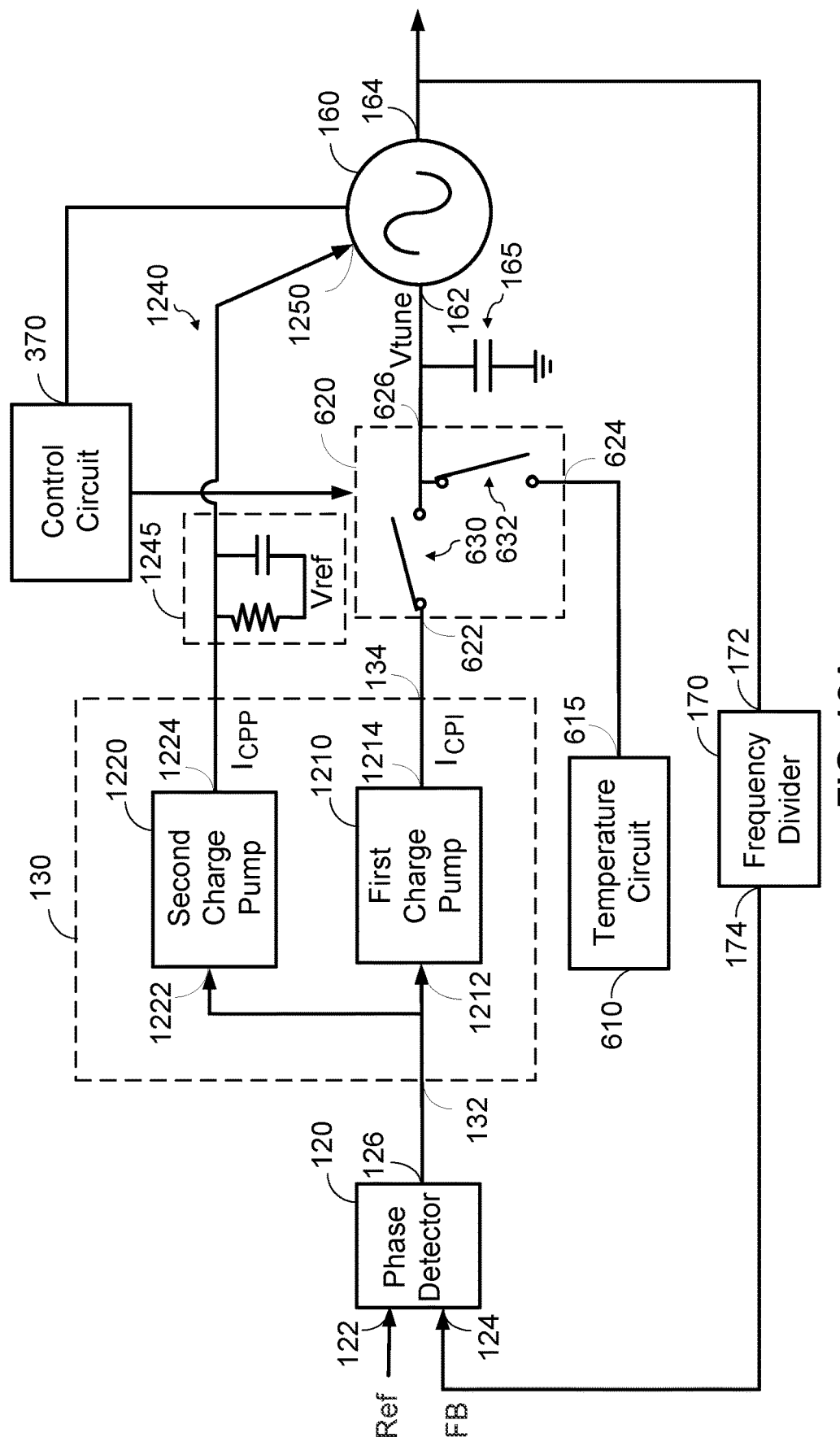
FIG. 12A shows another exemplary implementation of a phase-to-current circuit according to certain aspects of the present disclosure.

FIG. 12A shows another exemplary implementation of the phase-to-current circuit 130 according to certain aspects. In this example, the phase-to-current circuit 130 includes a first charge pump 1210 for the integral path, and a second charge pump 1220 for the proportional path. The first charge pump 1210 has an input 1212 coupled to the output 126 of the phase detector 120 and an output 1214 coupled to the first terminal 622 of the switching circuit 620. In this example, the first charge pump 1210 is configured to receive the phase signal (e.g., up signal and down signal) from the phase detector 120 and provide a current (labeled "$I_{CPI}$") based the phase signal. In certain aspects, the current may flow in either direction depending on whether the reference signal leads or lags the feedback signal. For the example where the phase signal includes the up signal and the down signal, the first charge pump 1210 may supply current to the capacitor 165 when the up signal is high and draw current from the capacitor 165 when the down signal is high. However, it is to be appreciated that the first charge pump 1210 is not limited to this example.

In this example, the second charge pump 1220 has an input 1222 coupled to the output 126 of the phase detector 120, and an output 1224 coupled to a proportional path 1240. The proportional path 1240 is coupled between the output 1224 of the second charge pump 1220 and a second input 1250 of the VCO 160, and may include an RC filter 1245 including a resistor and a capacitor coupled to a reference voltage. The second charge pump 1220 is configured to receive the phase signal (e.g., up signal and down signal) from the phase detector 120 and provide a current (labeled "$I_{CPP}$") based the phase signal. In certain aspects, the current may flow in either direction depending on whether the reference signal leads or lags the feedback signal. For the example where the phase signal includes the up signal and the down signal, the second charge pump 1220 may supply current to the RC filter 1245 when the up signal is high and draw current from the RC filter 1245 when the down signal is high.

Figure 12B:
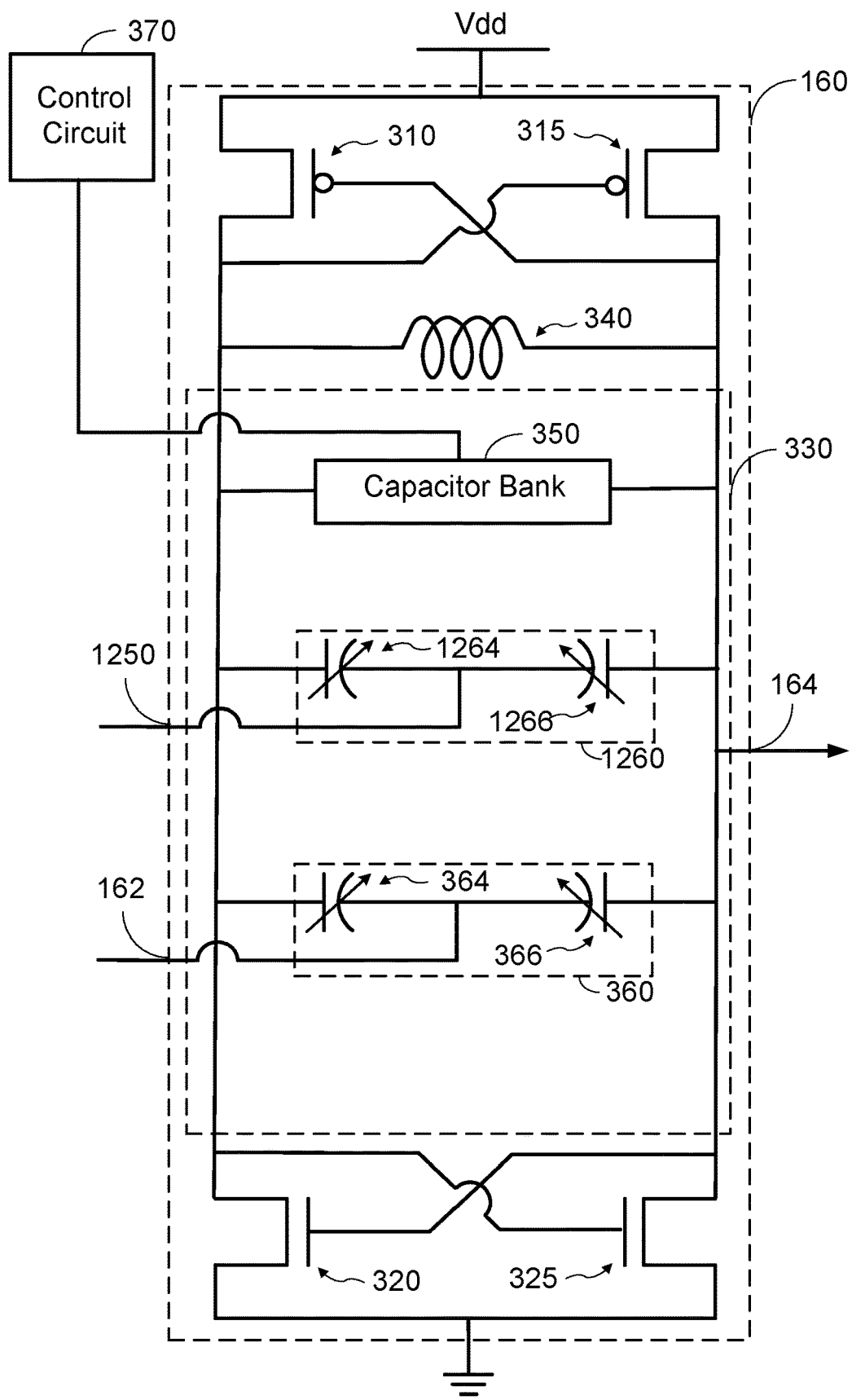
FIG. 12B shows another example of a VCO including multiple voltage-controlled capacitors according to certain aspects of the present disclosure.

As shown in FIG. 12B, the LC tank 330 in the VCO 160 may further include a second voltage-controlled capacitor 1260 coupled to the proportional path 1240 via the second input 1250. The second voltage-controlled capacitor 1260 may include a first varactor 1264 and a second varactor 1266. The first varactor 1264 and the second varactor 1266 may be coupled in series (e.g., in a back-to-back configuration). In this example, the second input 1250 of the VCO 160 is coupled between the first varactor 1264 and the second varactor 1266. Each of the varactors 1264 and 1266 may be implemented with a metal-oxide-semiconductor (MOS) varactor, a diode, or another type of varactor.

Figure 13:
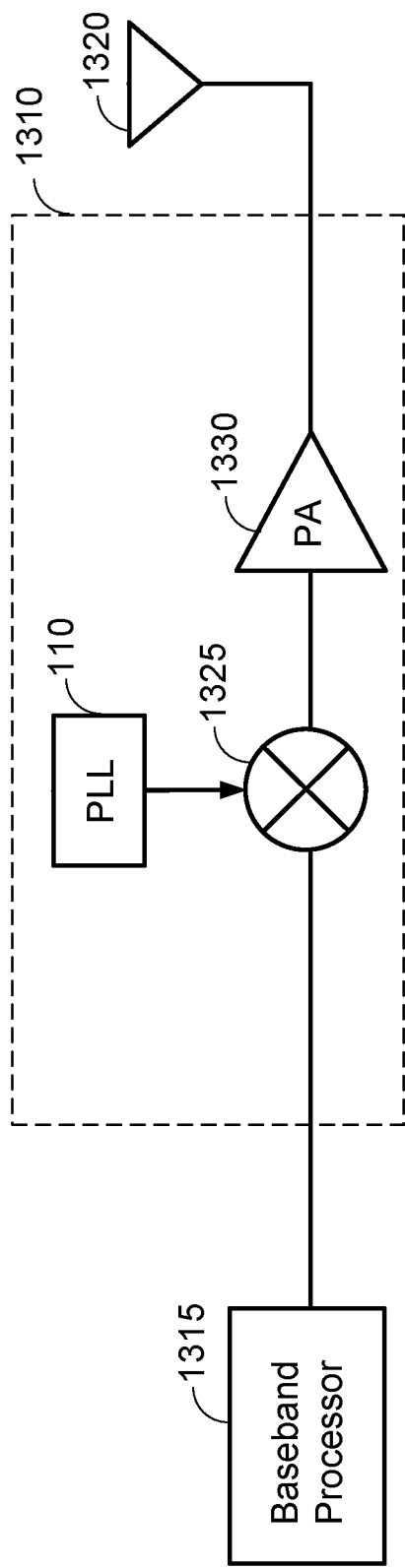
FIG. 13 shows an example of a transmitter including a PLL according to certain aspects of the present disclosure.

As discussed above, the PLL 110 may be used in a wireless communications system. In this regard, FIG. 13 shows an example of a transmitter 1310 including the PLL 110 according to certain aspects. In this example, the transmitter 1310 includes a mixer 1325 coupled to a baseband processor 1315 and the PLL 110, and a power amplifier 1330 coupled between the mixer 1325 and an antenna 1320. The PLL 110 outputs a local oscillator signal (e.g., from the output 164 of the VCO 160) to the mixer 1325.

In operation, the baseband processor 1315 may receive data and process the data into a baseband signal. Processing performed by the baseband processor 1315 may include coding, modulation, etc. The mixer 1325 mixes the baseband signal with the local oscillator signal from the PLL 110 to frequency unconvert the baseband signal into a radio frequency (RF) signal. The power amplifier 1330 amplifies the RF signal and outputs the amplified RF signal to the antenna 1320 for transmission.

It is to be appreciated that the transmitter 1310 may include one or more additional components (e.g., filter, phase shifter, etc.) not shown in FIG. 13.

Figure 14:
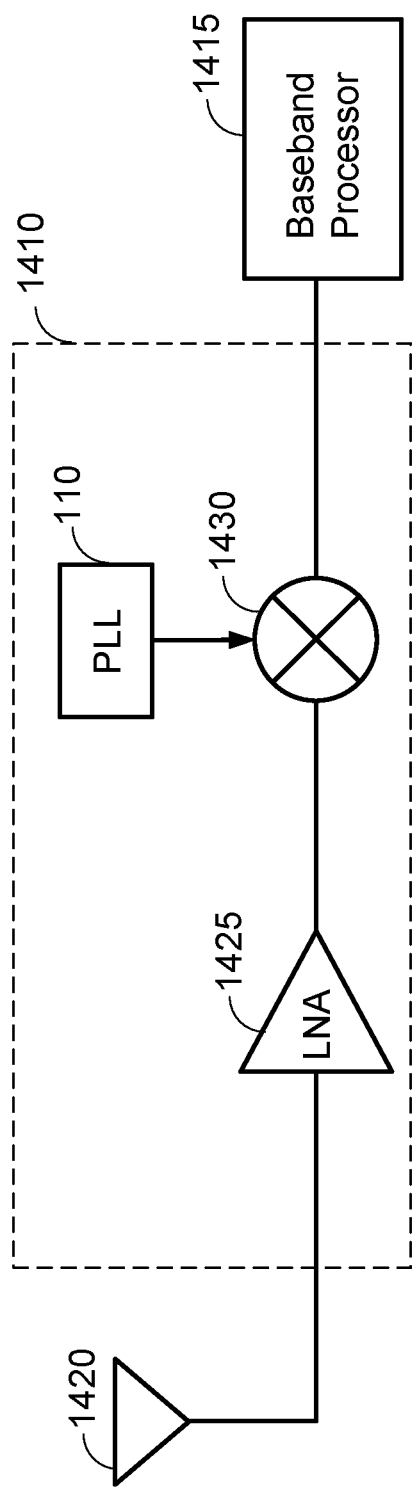
FIG. 14 shows an example of a receiver including a PLL according to certain aspects of the present disclosure.

FIG. 14 shows an example of a receiver 1410 including the PLL 110 according to certain aspects. In this example, the receiver 1410 includes a mixer 1430 coupled to a baseband processor 1415 and the PLL 110, and a low-noise amplifier 1425 coupled between an antenna 1420 and the mixer 1430. The PLL 110 outputs a local oscillator signal (e.g., from the output 164 of the VCO 160) to the mixer 1430.

In operation, the antenna 1320 receives an RF signal, and the low-noise amplifier 1425 amplifies the RF signal. The mixer 1430 mixes the RF signal from the low-noise amplifier 1425 with the local oscillator signal from the PLL 110 to frequency downconvert the RF signal into a baseband signal. The baseband processor 1415 receives the baseband signal and processes the baseband signal. Processing performed by the baseband processor 1415 may include demodulation, decoding, etc.

It is to be appreciated that the receiver 1410 may include one or more additional components (e.g., filter, phase shifter, etc.) not shown in FIG. 14.

Figure 15:
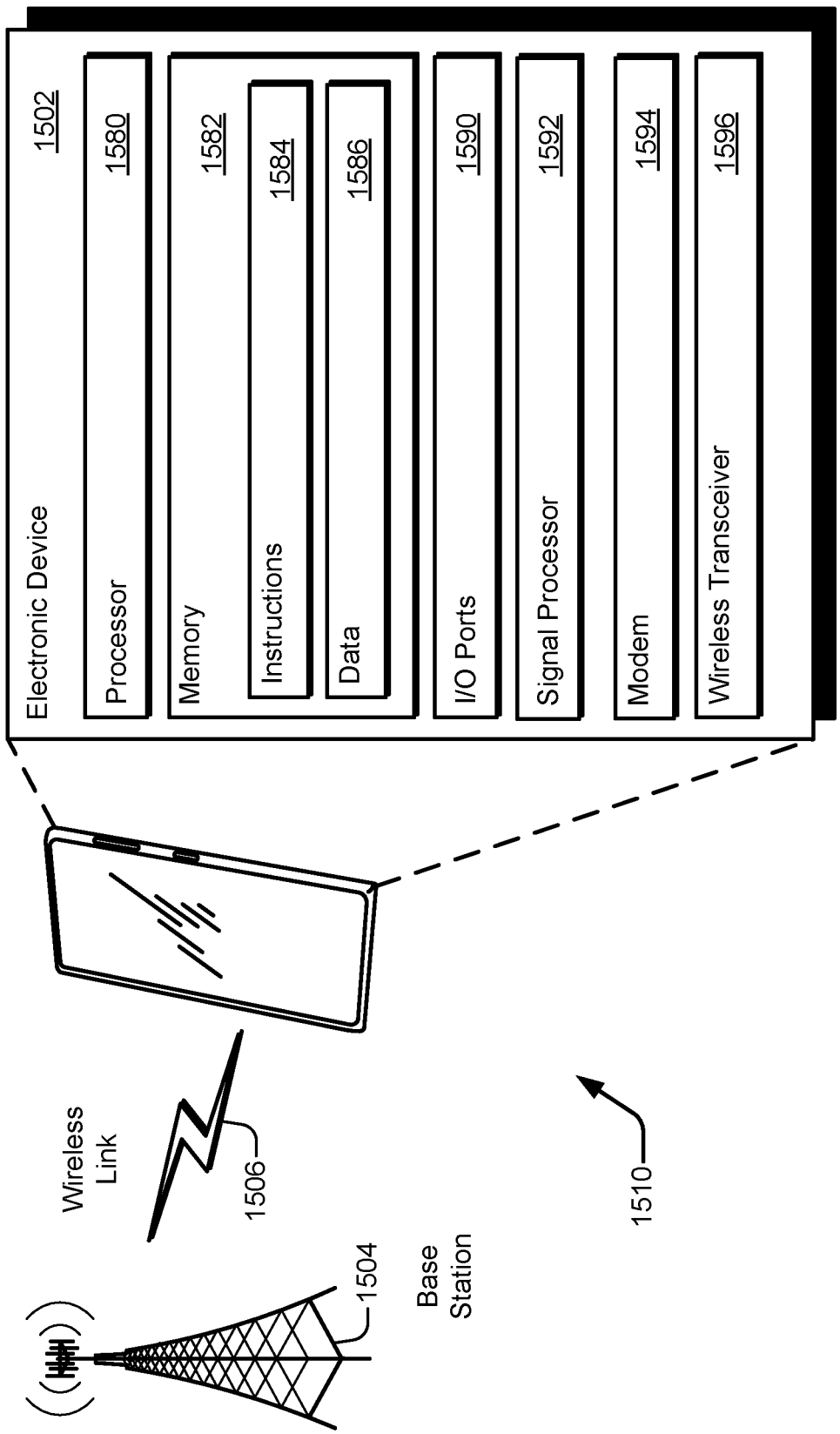
FIG. 15 is a diagram of an environment including an electronic device that includes a transceiver according to certain aspects of the present disclosure.

FIG. 15 is a diagram of an environment 1500 that includes an electronic device 1502 and a base station 1504. The electronic device 1502 includes a wireless transceiver 1596, which may include the transmitter 1310 and/or the receiver 1410.

In the environment 1400, the electronic device 1502 communicates with the base station 1504 through a wireless link 1506. As shown, the electronic device 1502 is depicted as a smart phone. However, the electronic device 1502 may be implemented as any suitable computing or other electronic device, such as a cellular base station, a broadband router, an access point, a cellular or mobile phone, a gaming device, a navigation device, a media device, a laptop computer, a desktop computer, a tablet computer, a server computer, a network-attached storage (NAS) device, a smart appliance, a vehicle-based communication system, an Internet of Things (IoT) device, a sensor or security device, an asset tracker, and so forth.

The base station 1504 communicates with the electronic device 1502 via the wireless link 1506, which may be implemented as any suitable type of wireless link. Although depicted as a base station tower of a cellular radio network, the base station 1504 may represent or be implemented as another device, such as a satellite, terrestrial broadcast tower, access point, peer to peer device, mesh network node, fiber optic line, another electronic device generally as described above, and so forth. Hence, the electronic device 1502 may communicate with the base station 1504 or another device via a wired connection, a wireless connection, or a combination thereof. The wireless link 1506 can include a downlink of data or control information communicated from the base station 1504 to the electronic device 1502 and an uplink of other data or control information communicated from the electronic device 1502 to the base station 1504. The wireless link 1506 may be implemented using any suitable communication protocol or standard, such as 3rd Generation Partnership Project Long-Term Evolution (3GPP LTE, 3GPP NR 5G), IEEE 1502.11, IEEE 1502.11, Bluetooth™, and so forth.

The electronic device 1502 includes a processor 1580 and a memory 1582. The memory 1582 may be or form a portion of a computer readable storage medium. The processor 1580 may include any type of processor, such as an application processor or a multi-core processor, that is configured to execute processor-executable instructions (e.g., code) stored by the memory 1582. The memory 1582 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1582 is implemented to store instructions 1584, data 1586, and other information of the electronic device 1502.

The electronic device 1502 may also include input/output (I/O) ports 1590. The I/O ports 1590 enable data exchanges or interaction with other devices, networks, or users or between components of the device.

The electronic device 1502 may further include a signal processor (SP) 1592 (e.g., such as a digital signal processor (DSP)). The signal processor 1592 may function similar to the processor 1580 and may be capable of executing instructions and/or processing information in conjunction with the memory 1582.

For communication purposes, the electronic device 1502 also includes a modem 1594 (e.g., baseband processor 1315 and/or 1415), the wireless transceiver 1596 (e.g., the transmitter 1310 and/or the receiver 1410), and one or more antennas (e.g., 1320 and/or 1415). The wireless transceiver 1596 provides connectivity to respective networks and other electronic devices connected therewith using RF wireless signals. The wireless transceiver 1596 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Figure 16:
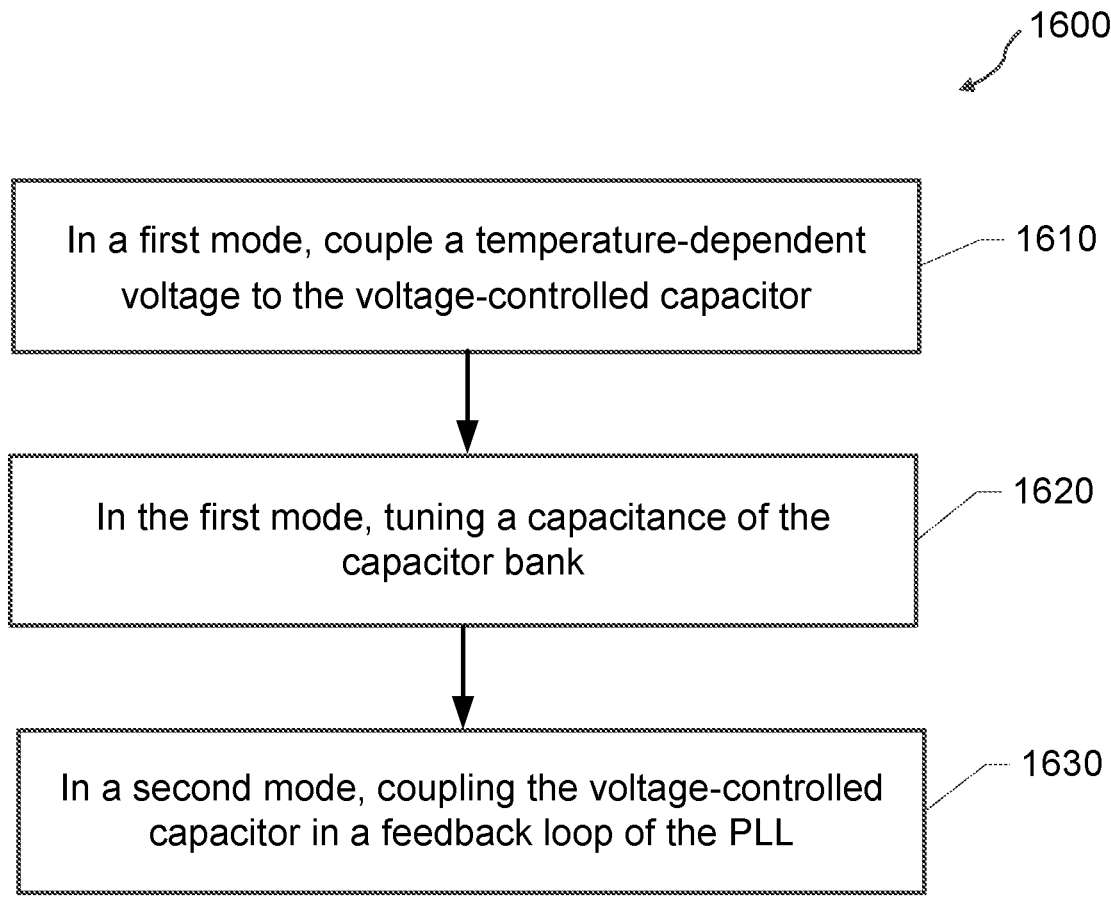
FIG. 16 is a flowchart illustrating a method of operating a PLL according to certain aspects of the present disclosure.

FIG. 16 illustrates an example of a method 1600 for operating a PLL (e.g., PLL 110) according to certain aspects of the present disclosure. The PLL includes a voltage-controlled oscillator (e.g., VCO 160), the VCO including a voltage-controlled capacitor (e.g., voltage-controlled capacitor 360) and a capacitor bank (e.g., the capacitor bank 350).

At block 1610, in a first mode, a temperature-dependent voltage is coupled to the voltage-controlled capacitor. For example, the control circuit 370 and the switching circuit 620 may couple the temperature-dependent voltage to an input of the voltage-controlled capacitor. For example, the temperature-dependent voltage may be generated by the temperature circuit 610.

At block 1620, in the first mode, a capacitance of the capacitor bank is tuned. For example, the capacitance of the capacitor bank may be tuned by the control circuit 370. For example, the capacitor bank may have multiple capacitance settings, and tuning the capacitance of the capacitor bank may include determining one of the multiple capacitance settings resulting in a frequency of the VCO that is closest to a target frequency.

At block 1630, in a second mode, the voltage-controlled capacitor is coupled in feedback loop of the PLL. For example, the control circuit 370 and the switching circuit 620 may couple the voltage-controlled capacitor in the feedback loop. In certain aspects, the feedback loop includes a phase detector (e.g., phase detector 120), a frequency divider (e.g., frequency divider 170) coupled between the VCO and the phase detector, and a phase-to-current circuit (e.g., phase-to-current circuit 130) coupled to an output of the phase detector. In these aspects, coupling the voltage-controlled capacitor in the feedback loop of the PLL comprises coupling an output of the phase-to-current circuit to the input of the voltage-controlled capacitor. In some implementations, the phase-to-current circuit may include the phase-to-voltage circuit 210 and the transconductance amplifier 230. In other implementations, the phase-to-current circuit may include the first charge pump 1210.

In certain aspects, the method 1600 may include decoupling the temperature-dependent voltage from the input of the voltage-controlled capacitor in the second mode, and decoupling the output of the phase-to-current circuit from the input of the voltage-controlled capacitor in the first mode.

Implementation examples are described in the following numbered clauses:

1. A system comprising:
    a voltage-controlled oscillator (VCO) having a first input and an output;
    a phase detector having a first input, a second input, and an output, wherein the first input of the phase detector is configured to receive a reference signal;
    a frequency divider coupled between the output of the VCO and the second input of the phase detector;
    a phase-to-current circuit having an input and an output, wherein the input of the phase-to-current circuit is coupled to the output of the phase detector;
    a temperature circuit having an output, wherein the temperature circuit is configured to output a temperature-dependent voltage at the output of the temperature circuit;
    a switching circuit having a first terminal, a second terminal, and a third terminal, wherein the first terminal is coupled to the output of the phase-to-current circuit, the second terminal is coupled to the output of the temperature circuit, and the third terminal is coupled to the first input of the VCO; and
    a capacitor coupled to the first input of the VCO.
2. The system of clause 1, wherein the capacitor is coupled between the third terminal of the switching circuit and the first input of the VCO.
3. The system of clause 1 or 2, wherein the VCO comprises:
    a voltage-controlled capacitor coupled to the first input of the VCO; and
    a capacitor bank coupled in parallel with the voltage-controlled capacitor.
4. The system of clause 3, wherein the voltage-controlled capacitor comprises a first varactor and a second varactor coupled in series, wherein the first input of the VCO is coupled between the first varactor and the second varactor.
5. The system of clause 3 or 4, wherein the capacitor bank comprises switchable capacitors coupled in parallel, and each of the switchable capacitors comprises one or more capacitors and one or more switches coupled in series.
6. The system of any one of clauses 3 to 5, wherein the VCO further comprises an inductor coupled in parallel with the voltage-controlled capacitor and the capacitor bank.
7. The system of any one of clauses 3 to 6, further comprising a control circuit, wherein the control circuit is configured to:
    in a first mode, cause the switching circuit to couple the second terminal to the third terminal;
    in the first mode, tune a capacitance of the capacitor bank; and
    in a second mode, cause the switching circuit to couple the first terminal to the third terminal.
8. The system of clause 7, wherein the capacitor bank has multiple capacitance settings, and the control circuit is configured to sequentially set the capacitor bank to different ones of the capacitance settings to tune the capacitance of the capacitor bank.
9. The system of clause 8, wherein the control circuit is configured to determine one of the multiple capacitance settings resulting in a frequency at the output of the VCO that is closest to a target frequency.
10. The system of clause 9, wherein each of the multiple capacitance settings is set by a respective one of multiple codes, and the control circuit is configured to determine one of the multiple codes resulting a frequency at the output of the VCO that is closest to a target frequency.
11. The system of clause 10, wherein the capacitor bank comprises switchable capacitors coupled in parallel, and each of the multiple codes corresponds to a different combination of the switchable capacitors that are switched on.
12. The system of any one of clauses 1 to 11, wherein the phase-to-current circuit comprises:
    a phase-to-voltage circuit coupled to the output of the phase detector, wherein the phase-to-voltage circuit is configured to generate a first voltage and a second voltage based on a phase signal from the phase detector, output the first voltage at a first output of the phase-to-voltage circuit, and output the second voltage at a second output of the phase-to-voltage circuit; and
    a transconductance amplifier configured to generate a current based on the first voltage and the second voltage, and provide the current at the output of the phase-to-current circuit.
13. The system of clause 12, further comprising:
    a first path coupled between the first output of the phase-to-voltage circuit and a second input of the VCO; and
    a second path coupled between the second output of the phase-to-voltage circuit and a third input of the VCO.
14. The system of clause 13, wherein the VCO comprises:
    a first voltage-controlled capacitor coupled to the first input of the VCO;
    a second voltage-controlled capacitor coupled to the second input of the VCO; and
    a third voltage-controlled capacitor coupled to the third input of the VCO.
15. The system of clause 14, wherein the VCO further comprises an inductor coupled in parallel with the first voltage-controlled capacitor, the second voltage-controlled capacitor, and the third voltage-controlled capacitor.
16. The system of any one of clauses 1 to 15, wherein the temperature circuit comprises:
    a first current source configured to generate a first current that is temperature dependent;
    a resistor coupled to the first current source; and
    a buffer having an input and an output, wherein the output of the buffer is coupled to the output of the temperature circuit, and the input of the buffer is coupled between the first current source and the resistor.
17. The system of clause 16, wherein the first current is proportional to temperature.
18. The system of clause 16 or 17, wherein the first current source is coupled between a supply rail and the input of the buffer, and the resistor is coupled between the input of the buffer and a ground.
19. The system of any one of clauses 16 to 18, wherein the temperature circuit further comprises a second current source coupled to the resistor, wherein the second current source is configured to generate a second current that is approximately constant over temperature.

20. The system of clause 19, wherein the first current source is coupled between the input of the buffer and a ground, the second current source is coupled between a supply rail and the input of the buffer, and the resistor is coupled between the input of the buffer and the ground.

21. The system of any one of clauses 16 to 20, wherein the buffer is a unity-gain buffer.

22. The system of any one of clauses 16 to 21, wherein the buffer includes an amplifier having an output, a first input, and a second input, wherein the output of the amplifier is coupled to the first input of the amplifier and the output of the buffer, and the second input of the amplifier is coupled to the input of the buffer.

23. The system of any one of clauses 1 to 22, wherein the switching circuit comprises:
a first switch coupled between the first terminal and the third terminal; and
a second switch coupled between the second terminal and the third terminal.

24. The system of any one of clauses 1 to 11 and 16 to 23, wherein the phase-to-current circuit includes a charge pump having input coupled to the output of the phase detector, and an output coupled to the first terminal of the switching circuit.

25. A method for operating a phase locked loop (PLL), wherein the PLL includes a voltage-controlled oscillator (VCO), the VCO including a voltage-controlled capacitor and a capacitor bank, the method comprising:
in a first mode,
coupling a temperature-dependent voltage to the voltage-controlled capacitor; and
tuning a capacitance of the capacitor bank; and
in a second mode, coupling the voltage-controlled capacitor in a feedback loop of the PLL.

26. The method of clause 25, wherein the voltage-controlled capacitor comprises a first varactor and a second varactor coupled in series.

27. The method of clause 25 or 26, wherein the capacitor bank has multiple capacitance settings, and tuning the capacitance of the capacitor bank comprises sequentially setting the capacitor bank to different ones of the capacitance settings.

28. The method of clause 27, further comprising determining one of the multiple capacitance settings resulting in a frequency of the VCO that is closest to a target frequency.

29. The method of clause 28, further comprising:
in the second mode, setting the capacitance of the capacitor bank to the determined one of the multiple capacitance settings.

30. The method of any one of clauses 25 to 29, wherein:
the PLL includes a temperature circuit configured to generate the temperature-dependent voltage; and
coupling the temperature-dependent voltage to the voltage-controlled capacitor comprises coupling an output of the temperature circuit to an input of the voltage-controlled capacitor.

31. The method of any one of clauses 25 to 30, wherein:
the feedback loop includes a phase detector, a frequency divider coupled between an output of the VCO and an input of the phase detector, and a phase-to-current circuit coupled to an output of the phase detector; and
coupling the voltage-controlled capacitor in the feedback loop of the PLL comprises coupling an output of the phase-to-current circuit to an input of the voltage-controlled capacitor.

32. The method of clause 31, wherein the PLL includes a capacitor coupled to the input of the voltage-controlled capacitor.

33. An apparatus comprises:
a voltage-controlled oscillator (VCO) including a voltage-controlled capacitor and a capacitor bank;
means for generating a temperature-dependent voltage;
means for inputting the temperature-dependent voltage to the voltage-controlled capacitor in a first mode;
means for tuning a capacitance of the capacitor bank in the first mode; and means for coupling the voltage-controlled capacitor in a feedback loop of a phase locked loop (PLL) including the VCO in a second mode.

34. A system comprising:
a voltage-controlled oscillator (VCO);
a phase detector configured to receive a reference signal;
a frequency divider coupled between an output of the VCO and the phase detector;
a phase-to-voltage circuit coupled to an output of the phase detector;
a transconductance device coupled to an output of the phase-to-voltage circuit;
a temperature circuit configured to output a temperature-dependent voltage; and
a switching circuit configured to selectively couple the transconductance device to an input of the VCO and configured to selectively couple the temperature circuit to the input of the VCO.

35. The system of clause 34, further comprising at least one resistor-capacitor network coupled between the output of the phase-to-voltage circuit and the VCO.

36. The system of clause 34 or 35, wherein the VCO comprises:
a voltage-controlled capacitor coupled to the input of the VCO; and
a capacitor bank coupled in parallel with the voltage-controlled capacitor.

37. The system of clause 36, wherein the voltage-controlled capacitor comprises a first varactor and a second varactor coupled in series, wherein the input of the VCO is coupled between the first varactor and the second varactor.

38. The system of clause 36 or 37, wherein the capacitor bank comprises switchable capacitors coupled in parallel, and each of the switchable capacitors comprises one or more capacitors and one or more switches coupled in series.

39. The system of any one of clauses 36 to 38, wherein the VCO further comprises an inductor coupled in parallel with the voltage-controlled capacitor and the capacitor bank.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system comprising:
    a voltage-controlled oscillator (VCO) having a first input, a second input, a third input, and an output;
    a phase detector having a first input, a second input, and an output, wherein the first input of the phase detector is configured to receive a reference signal;
    a frequency divider coupled between the output of the VCO and the second input of the phase detector;
    a phase-to-voltage circuit coupled to the output of the phase detector, wherein the phase-to-voltage circuit is configured to generate a first voltage and a second voltage based on a phase signal from the phase detector, output the first voltage at a first output of the phase-to-voltage circuit, and output the second voltage at a second output of the phase-to-voltage circuit;
    a transconductance amplifier configured to generate a current based on the first voltage and the second voltage, and provide the current at an output of the transconductance amplifier;
    a first path coupled between the first output of the phase-to-voltage circuit and the second input of the VCO;
    a second path coupled between the second output of the phase-to-voltage circuit and the third input of the VCO;
    a temperature circuit having an output, wherein the temperature circuit is configured to output a temperature-dependent voltage at the output of the temperature circuit;
    a switching circuit having a first terminal, a second terminal, and a third terminal, wherein the first terminal is coupled to the output of the transconductance amplifier, the second terminal is coupled to the output of the temperature circuit, and the third terminal is coupled to the first input of the VCO; and
    a capacitor coupled to the first input of the VCO.

2. The system of claim 1, wherein the capacitor is coupled between the third terminal of the switching circuit and the first input of the VCO.

3. The system of claim 1, wherein the VCO comprises:
    a voltage-controlled capacitor coupled to the first input of the VCO; and
    a capacitor bank coupled in parallel with the voltage-controlled capacitor.

4. The system of claim 3, wherein the voltage-controlled capacitor comprises a first varactor and a second varactor coupled in series, wherein the first input of the VCO is coupled between the first varactor and the second varactor.

5. The system of claim 3, wherein the capacitor bank comprises switchable capacitors coupled in parallel, and each of the switchable capacitors comprises one or more capacitors and one or more switches coupled in series.

6. The system of claim 3, wherein the VCO further comprises an inductor coupled in parallel with the voltage-controlled capacitor and the capacitor bank.

7. The system of claim 3, further comprising a control circuit, wherein the control circuit is configured to:
    in a first mode, cause the switching circuit to couple the second terminal to the third terminal;
    in the first mode, tune a capacitance of the capacitor bank; and
    in a second mode, cause the switching circuit to couple the first terminal to the third terminal.

8. The system of claim 7, wherein the capacitor bank has multiple capacitance settings, and the control circuit is configured to sequentially set the capacitor bank to different ones of the capacitance settings to tune the capacitance of the capacitor bank.

9. The system of claim 1, wherein the VCO comprises:
    a first voltage-controlled capacitor coupled to the first input of the VCO;
    a second voltage-controlled capacitor coupled to the second input of the VCO; and
    a third voltage-controlled capacitor coupled to the third input of the VCO.

10. The system of claim 9, wherein the VCO comprises a capacitor bank coupled in parallel with the first voltage-controlled capacitor, the second voltage-controlled capacitor, and the third voltage-controlled capacitor.

11. The system of claim 1, wherein the switching circuit comprises:
    a first switch coupled between the first terminal and the third terminal; and
    a second switch coupled between the second terminal and the third terminal.

12. The system of claim 1, wherein the first path includes a first low-pass filter and the second path includes a second low-pass filter.

13. A system comprising:
    a voltage-controlled oscillator (VCO) having an input and an output;
    a phase detector having a first input, a second input, and an output, wherein the first input of the phase detector is configured to receive a reference signal;
    a frequency divider coupled between the output of the VCO and the second input of the phase detector;
    a phase-to-current circuit having an input and an output, wherein the input of the phase-to-current circuit is coupled to the output of the phase detector;
    a temperature circuit having an output, wherein the temperature circuit is configured to output a temperature-dependent voltage at the output of the temperature circuit, and wherein the temperature circuit comprises:
        a first current source configured to generate a first current that is temperature dependent;
        a resistor coupled to the first current source; and
        a buffer having an input and an output, wherein the output of the buffer is coupled to the output of the temperature circuit, and the input of the buffer is coupled between the first current source and the resistor;
    a switching circuit having a first terminal, a second terminal, and a third terminal, wherein the first terminal is coupled to the output of the phase-to-current circuit, the second terminal is coupled to the output of the temperature circuit, and the third terminal is coupled to the input of the VCO; and a capacitor coupled to the input of the VCO.

14. The system of claim 13, wherein the first current is proportional to temperature.

15. The system of claim 13, wherein the first current source is coupled between a supply rail and the input of the buffer, and the resistor is coupled between the input of the buffer and a ground.

16. The system of claim 13, wherein the temperature circuit further comprises a second current source coupled to the resistor, wherein the second current source is configured to generate a second current that is approximately constant over temperature.

17. The system of claim 16, wherein the first current source is coupled between the input of the buffer and a ground, the second current source is coupled between a supply rail and the input of the buffer, and the resistor is coupled between the input of the buffer and the ground.

18. A system comprising:
a voltage-controlled oscillator (VCO) having a first input, a second input, and an output;
a phase detector having a first input, a second input, and an output, wherein the first input of the phase detector is configured to receive a reference signal;
a frequency divider coupled between the output of the VCO and the second input of the phase detector;
a temperature circuit having an output, wherein the temperature circuit is configured to output a temperature-dependent voltage at the output of the temperature circuit;
a first charge pump having an input coupled to the output of the phase detector;
a second charge pump having an input coupled to the output of the phase detector and an output coupled to the second input of the VCO;
a switching circuit having a first terminal, a second terminal, and a third terminal, wherein the first terminal is coupled to an output of the first charge pump, the second terminal is coupled to the output of the temperature circuit, and the third terminal is coupled to the first input of the VCO; and
a capacitor coupled to the first input of the VCO.

19. The system of claim 18, wherein the VCO comprises:
a first voltage-controlled capacitor coupled to the first input of the VCO;
a second voltage-controlled capacitor coupled to the second input of the VCO; and
a capacitor bank coupled in parallel with the first voltage-controlled capacitor and the second voltage-controlled capacitor.

20. The system of claim 18, further comprising a resistor-capacitor network coupled to the output of the second charge pump.

21. A system comprising:
a voltage-controlled oscillator (VCO);
a phase detector configured to receive a reference signal;
a frequency divider coupled between an output of the VCO and the phase detector;
a phase-to-voltage circuit coupled to an output of the phase detector;
a transconductance device coupled to a first output and a second output of the phase-to-voltage circuit;
a temperature circuit configured to output a temperature-dependent voltage;
a switching circuit configured to selectively couple the transconductance device to a first input of the VCO and configured to selectively couple the temperature circuit to the first input of the VCO;
a first path coupled between the first output of the phase-to-voltage circuit and a second input of the VCO; and
a second path coupled between the second output of the phase-to-voltage circuit and a third input of the VCO.

22. The system of claim 21, wherein the first path comprises a first resistor-capacitor network and the second path comprises a second resistor-capacitor network.

23. The system of claim 21, wherein the VCO comprises:
a first voltage-controlled capacitor coupled to the first input of the VCO;
a second voltage-controlled capacitor coupled to the second input of the VCO;
a third voltage-controlled capacitor coupled to the second input of the VCO; and
a capacitor bank coupled in parallel with the first voltage-controlled capacitor, the second voltage-controlled capacitor, and the third voltage-controlled capacitor.

24. The system of claim 23, wherein the VCO further comprises an inductor coupled in parallel with the first voltage-controlled capacitor, the second voltage-controlled capacitor, the third voltage-controlled capacitor, and the capacitor bank.

* * * * *